United States Patent [19]
Yabe et al.

[11] Patent Number: 5,706,229
[45] Date of Patent: Jan. 6, 1998

[54] SEMICONDUCTOR MEMORY DEVICE

[75] Inventors: Tomoaki Yabe, Kawasaki; Shinji Miyano, Yokohama; Kenji Numata, Yamato, all of Japan

[73] Assignee: Kabushiki Kaisha Toshiba, Kawasaki, Japan

[21] Appl. No.: 553,035

[22] Filed: Nov. 3, 1995

[30] Foreign Application Priority Data

Nov. 11, 1994 [JP] Japan .................................. 6-277511

[51] Int. Cl.$^6$ ...................................... G11C 7/00
[52] U.S. Cl. ..................... 365/189.05; 365/203; 365/205
[58] Field of Search ................... 365/189.05, 203, 365/205, 208, 230.06

[56] References Cited

U.S. PATENT DOCUMENTS

| | | | |
|---|---|---|---|
| 4,855,959 | 8/1989 | Kobayashi | 365/189.05 X |
| 4,972,376 | 11/1990 | Torimaru et al. | 365/189.05 X |
| 5,053,998 | 10/1991 | Kannan et al. | 365/205 X |
| 5,111,386 | 5/1992 | Fujishima et al. | 365/189.05 X |
| 5,138,578 | 8/1992 | Fujii | 365/205 X |
| 5,241,503 | 8/1993 | Cheng | 365/205 |

*Primary Examiner*—Joseph A. Popek
*Attorney, Agent, or Firm*—Banner & Witcoff, Ltd.

[57] ABSTRACT

A semiconductor memory device includes a memory cell array having a plurality of memory cells arranged in rows and columns, a plurality of pairs of bit lines to each of which the plurality of memory cells arranged in the column direction are connected, a plurality of latch type amplifiers each of which is provided between the bit lines of a corresponding one of the bit line pairs to amplify a potential difference between the bit lines, a plurality of activation circuits for respectively activating the plurality of latch type amplifiers, a data bus acting as passages of input data, a plurality of latch type storage circuits each of which is provided on a corresponding one of the columns and connected to the data bus, for temporarily storing the input data, a plurality of transfer gates for transferring the input data from the latch type storage circuits to the latch type amplifiers, and a transfer control circuit for controlling the transfer gates to simultaneously transfer the input data from the latch type storage circuits to the latch type amplifiers for each of the rows, wherein the memory cell array is divided into a plurality of sub-arrays including a preset number of columns and the activation circuits are provided for the respective sub-arrays.

24 Claims, 15 Drawing Sheets

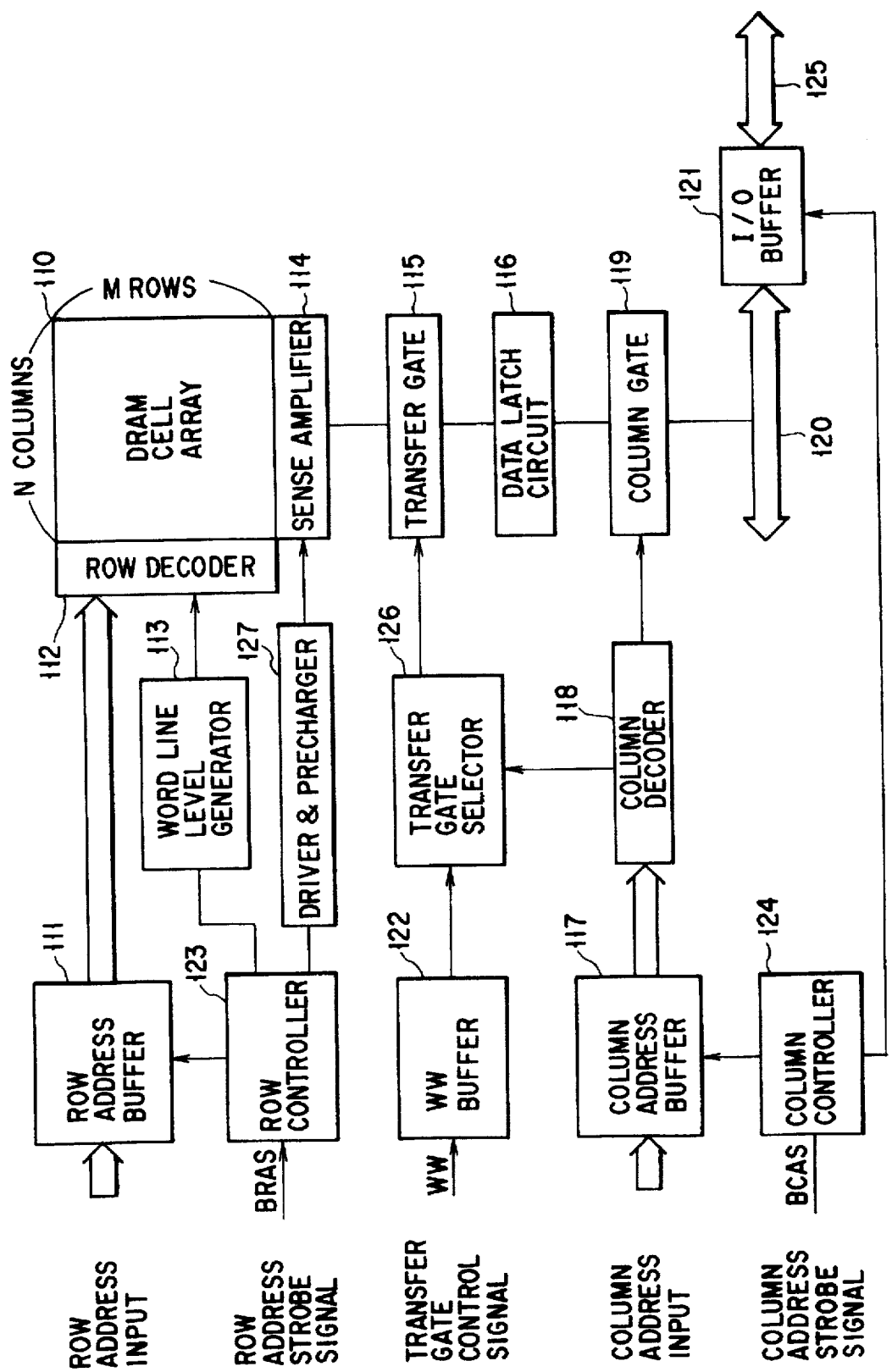
F I G. 1

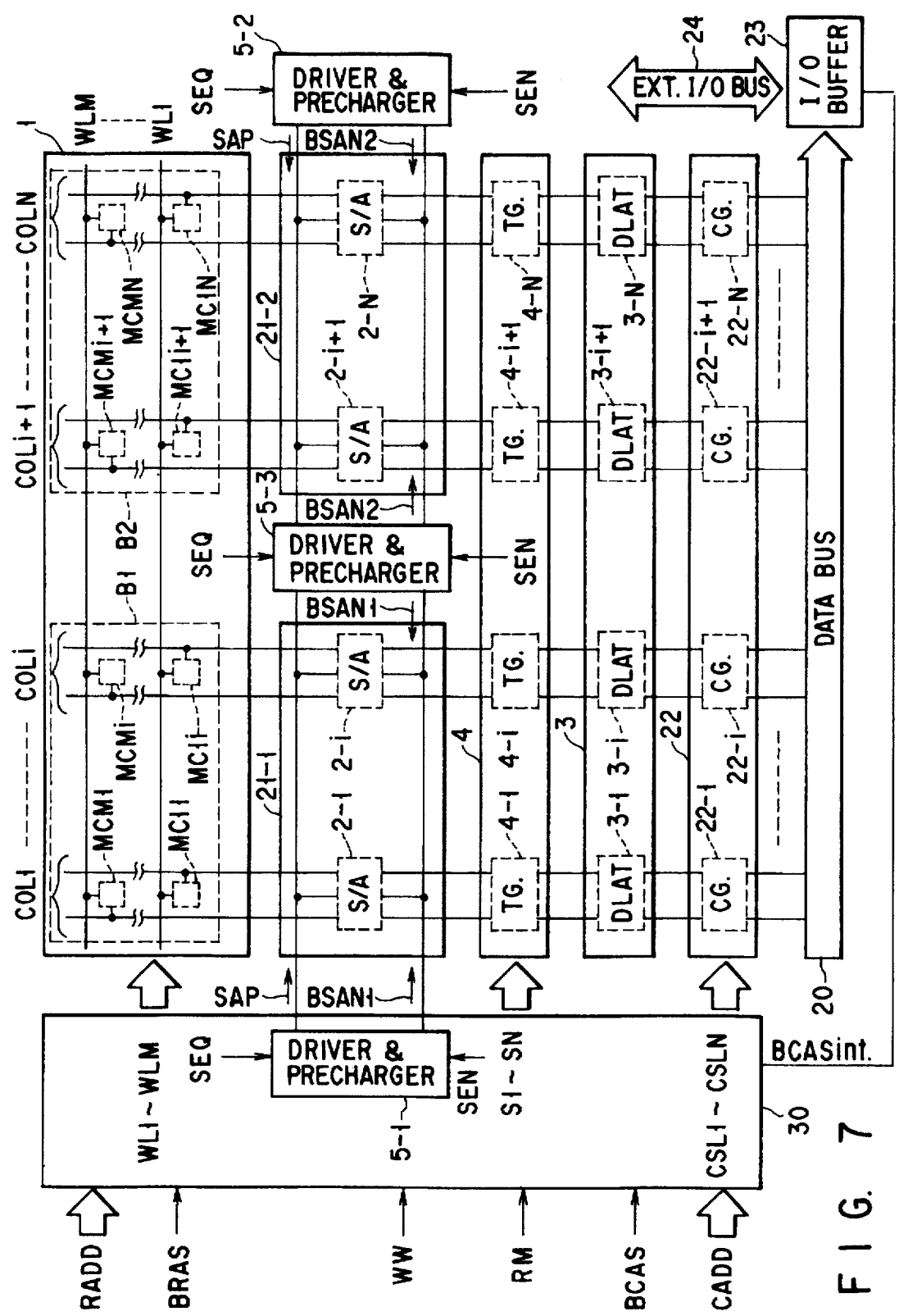
F I G. 7

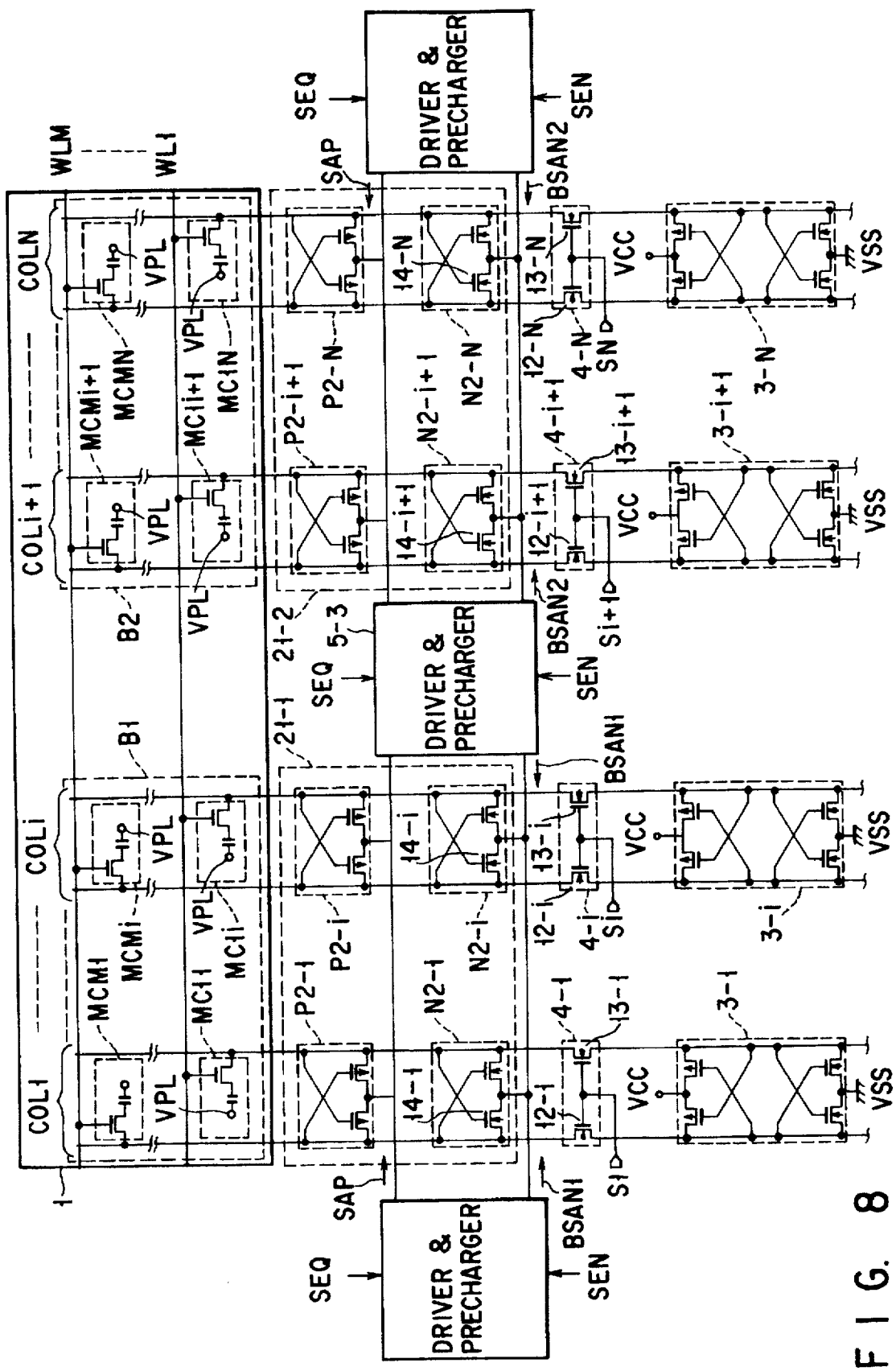
F I G. 8

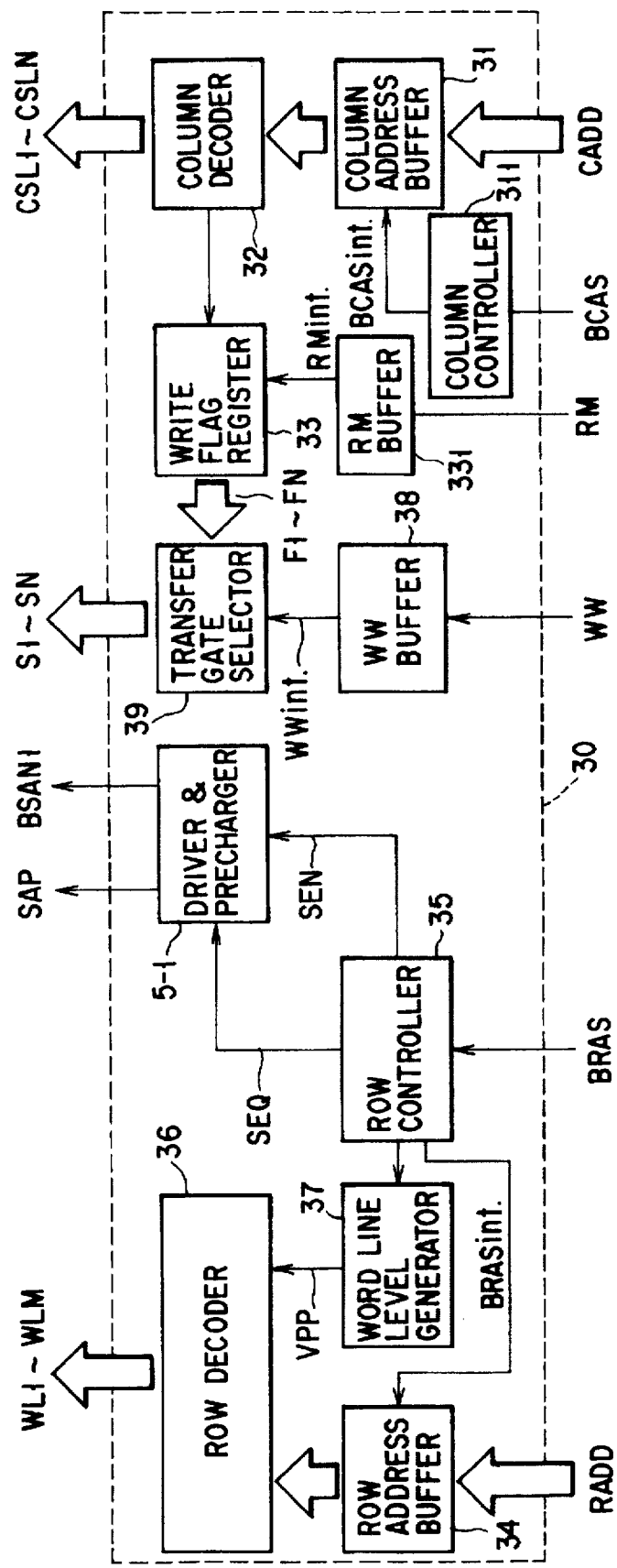
F I G. 9

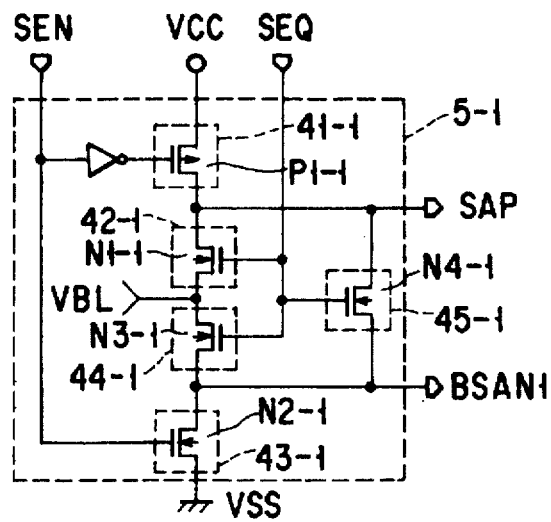
F I G. 13A
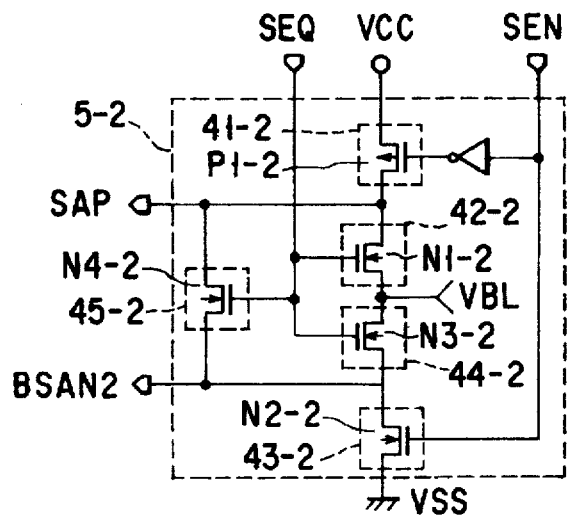
F I G. 13B
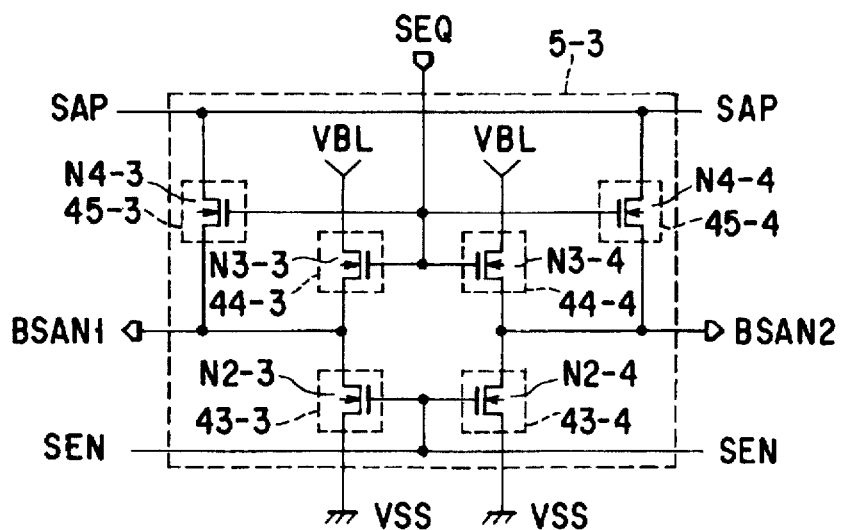
F I G. 13C

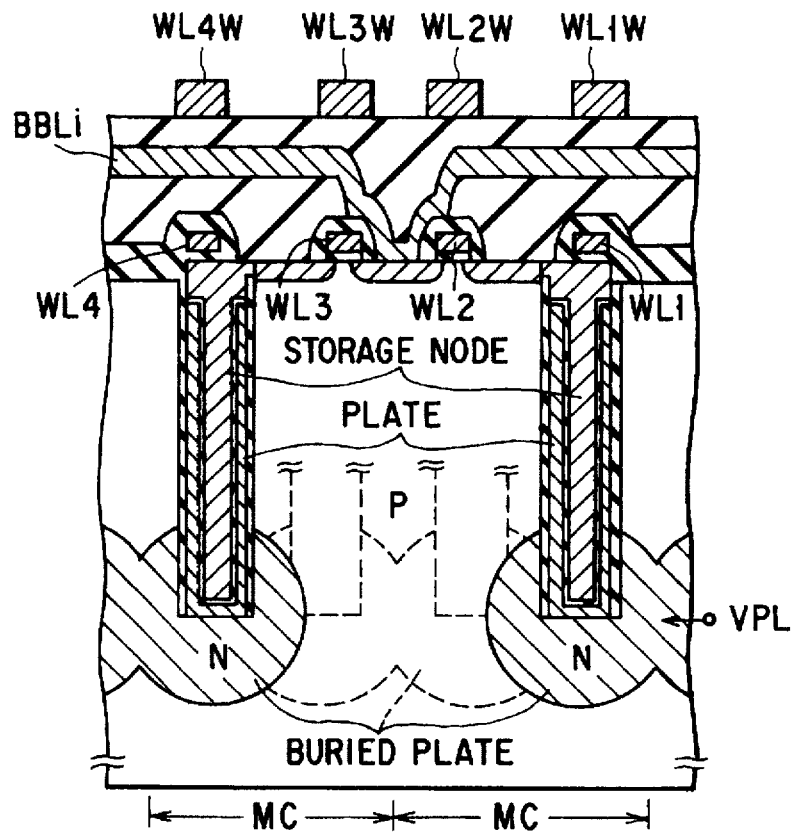
F I G. 16
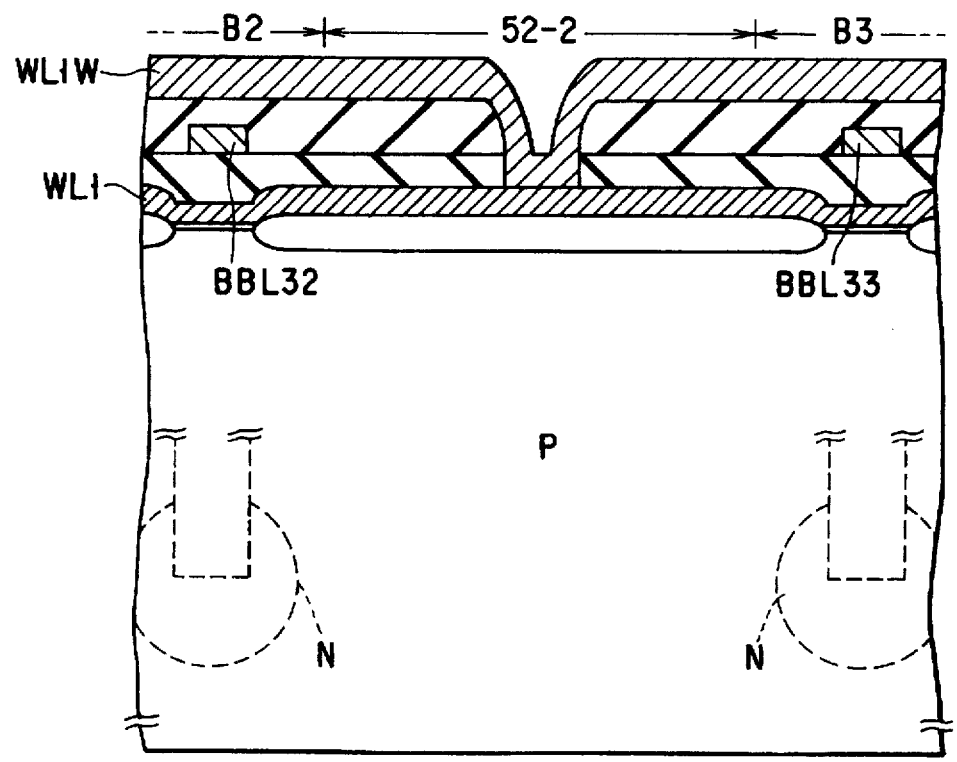
F I G. 17

5,706,229

SEMICONDUCTOR MEMORY DEVICE

BACKGROUND OF THE INVENTION

1. Field of the Invention

This invention relates to a semiconductor memory device and more particularly to the improvement of a sense amplifier for a dynamic RAM.

2. Description of the Related Art

With the development of the integrated circuit technology, semiconductor memory devices, especially, dynamic RAMs (which are hereinafter referred to as DRAMs) have come to be widely used in the field of electronics. Since it has become possible to form the DRAM of large capacity, applications requiring a large storage capacity of image memories or the like have been developed, but in this field, it is necessary to continuously read out stored data at high speed. At the time of readout of memory data, the main factor controlling the readout time is the time for readout from the memory cell to the sense amplifier. Therefore, various attempts have been made to apparently eliminate the readout time. For example, there is provided a data latch DRAM having a latch circuit which is provided between the sense amplifier and the I/O buffer and in which a readout instruction is temporarily held for future usage.

FIG. 1 shows the main portion of the general construction of the data latch DRAM. The data latch DRAM has a data latch circuit provided in the next stage of the sense amplifier in the memory core section of a normal standard DRAM. That is, in FIG. 1, 110 denotes a DRAM cell array, 111 a row address buffer, 112 a row decoder, 113 a word line level generator, 114 a sense amplifier, 115 a transfer gate, 116 a data latch circuit, 117 a column address buffer, 118 a column decoder, 119 a column selection gate, 120 a data bus, 121 an input/output (I/O) buffer, 122 a transfer gate control signal (WW) buffer, 123 a row controller, 124 a column controller, and 125 an external I/O bus. Further, the DRAM includes a transfer gate selector 126 as a control circuit for the transfer gate and a driver and precharger circuit 127 for the sense amplifier 114.

In this case, if the DRAM cell array 110 has a structure of M rows×N columns, the data latch circuit 116 is formed to have N latch circuits capable of holding data of one row. The structure is similar to the structure in which a cache portion is constructed by a data latch circuit of one row×N columns in a Cache DRAM.

The readout operation of the DRAM with the above construction is performed as follows. At the time of readout, a row address strobe signal (BRAS) is activated and a row address signal is input in synchronism with activation of the BRAS signal. By activation of the BRAS signal, the row controller 123 is driven and a boosted word line potential is created in the word line level generator 113. The boosted word line potential is given as a power supply of the row decoder 112 and the potential is supplied to a word line (not shown) selected by the row decoder 112.

If the word line is thus activated, data is read out from DRAM cells corresponding to the selected word line and supplied to corresponding bit lines (not shown). Further, in response to the signal of the row controller 123, a sense amplifier control signal generated from the driver and precharger circuit 127 is activated, data of N columns on the same row supplied to the bit lines as described before is sensed and latched by the N sense amplifiers 114. After this, the transfer gate control signal WW is activated to turn ON the transfer gate 115 between the sense amplifier 114 and the data latch circuit 116 so as to permit data latched by the sense amplifier 114 to be transferred to the data latch circuit 116. Latch data of the data latch circuit 116 is supplied via the column selection gate 119 selected by a column address signal input decoded by the column decoder 118 and then output to the external data bus 125 via the data bus 120 and input/output buffer 121.

In the above operation, after the transfer gate 115 is turned OFF when data is transferred to the data latch circuit 116, the DRAM cell array 110 and sense amplifier 114 can be operated independently of the data latch circuit 116 and the succeeding stage circuits.

Based on the above fact, if a next row address signal is input while data on the previous row is transferred between the data latch circuit 116 and the external data bus and new data on the row corresponding to the new row address is read out from the cell array 110 to the sense amplifier 114 and latched therein, new data can be transferred from the sense amplifier 114 to the data latch circuit 116 by turning ON the transfer gate 115 again when transfer of latch data from the data latch circuit 116 to the external data bus is terminated.

As a result, the time (normally, 50 ns or more) necessary for reading out data corresponding to the row address input from the DRAM cell array 110 to the sense amplifier 114 can be eliminated when viewing the DRAM from the external data bus. That is, new data can be read out at high speed from the data latch circuit 116 again after a short period of time (for example, 10 ns or less) required for transferring data from the sense amplifier 114 to the data latch circuit 116 by turning ON the transfer gate 115.

The schematic flow of the data writing operation of the data latch DRAM is explained as follows. First, data is input from the external I/O bus 125 to the I/O buffer 121. Then, a column address strobe (BCAS) signal is input to the column controller 124 from the outside of the chip and a column address signal is input to the column decoder 118 via the column address buffer 117 in synchronism with the BCAS signal. A column gate 119 corresponding to a column address designated by the column decoder 118 is activated. Further, the data is input from the I/O buffer 121 to the data bus 120 in synchronism with the BCAS signal. Then, data input to the data bus 120 is written into the data latch circuit 116 connected to the activated column gate. The operation of writing data into the data latch circuit 116 is performed with the transfer gate 115 kept in the OFF state. The above operation is repeatedly performed while changing write data and input column address. The operation of writing data into the data latch circuit 116 is performed only for columns which require rewriting of data. Therefore, data are not always written into all of the N data latch circuits 116.

Next, if the operation of writing data of one row from the data bus into the data latch circuit 116 is completed, the transfer gates 115 only for the columns for which data writing has been performed are turned ON to permit data to be simultaneously transferred from the data latch circuit 116 to the sense amplifiers 114 and memory cells 110. The operation can be attained by activating the transfer gate only for the columns for which data writing has been performed.

In the column for which data writing has not been performed, the same operation as the refresh operation in the normal DRAM is performed and data held in the memory cell is amplified again. Then, the data are written into the memory cell again. The above operations construct the schematic flow of the data writing operation.

However, in the DRAM with data latch having a function of transferring data as described above, if the number of columns in which simultaneous data transfer is performed increases, there occurs a possibility that the sense amplifier is incorrectly operated to invert and destroy the data to be refreshed in the column in which data transfer is not performed. That is, if the transfer gates of the columns in which data are written are simultaneously turned ON, the current driving ability of the driver and precharger circuit 127 for supplying a signal for driving the sense amplifiers 114 becomes insufficient and the signal potential fluctuates, thereby causing a possibility that data of the sense amplifier in which data rewriting is not performed are destroyed. This is a problem of the DRAM with data latch to be solved.

SUMMARY OF THE INVENTION

An object of this invention is to provide a semiconductor memory device capable of preventing destruction of data in columns in which data transfer is not performed even if the number of columns in which data transfer is simultaneously performed is large.

In order to attain the above object, a semiconductor memory device of this invention comprises a memory cell array having a plurality of memory cells arranged in a form of rows and columns; a plurality of pairs of bit lines to each of which those of the plurality of memory cells which are provided on a corresponding one of the columns of the memory cell array and arranged in the column direction are connected; a plurality of latch type amplifying means each of which is provided between the bit lines of a corresponding one of the bit line pairs to amplify a potential difference between the bit lines of the corresponding one of the bit line pairs; a plurality of activation means for respectively activating the plurality of latch type amplifying means; a data bus acting as passages of input data from the outside of the memory device to the plurality of memory cells; a plurality of latch type storage means each of which is provided on a corresponding one of the columns of the memory cell array and connected to the data bus, for temporarily storing the input data supplied from the data bus; a plurality of transfer means for transferring the input data temporarily stored in the latch type storage means from the latch type storage means to the latch type amplifying means; and transfer control means for controlling the plurality of transfer means to simultaneously transfer the input data temporarily stored in the latch type storage means from the latch type storage means corresponding to the columns for which transfer of the input data is required to the latch type amplifying means for each of the rows, wherein the memory cell array is divided into a plurality of sub-arrays including a preset number of columns and the plurality of activation means are provided for the respective sub-arrays.

Further, the plurality of activating means include means for driving the plurality of latch type amplifying means and means for precharging the plurality of latch type amplifying means.

The plurality of sub-arrays are formed in areas which are separated from one another and the plurality of activating means may be provided in areas adjacent to the separated areas.

Further, a plurality of bypass word lines insulatively formed in correspondence to a plurality of word lines formed for the respective rows are provided and the bypass word lines may be connected to the word lines in an area between the separated areas.

The plurality of latch type amplifying means each include a cross-coupled insulated gate FET pair of first conductivity type and a cross-coupled insulated gate FET pair of second conductivity type, each of the plurality of activating means includes a first circuit section for driving and precharging the insulated gate FET pair of the first conductivity type and at least some of the plurality of activating means each include a second circuit section for driving and precharging the insulated gate FET pair of the second conductivity type.

Further, the first conductivity type is preferably an N type and the second conductivity type is preferably a P type.

The number of the columns contained in the sub-array may be set to a value such that a voltage drop occurring in the precharge signal of the activation means will not exceed the threshold voltage of FETs constructing the first-conductivity type FET pair when the input data is transferred to all of the first-conductivity type FET pairs contained in the sub-array.

In the semiconductor memory device with the above construction, the memory cell array is divided into a plurality of sub-arrays in the column direction and the activation means are provided for the respective sub-arrays so as to reduce the load to be driven by one activation means. Therefore, even when the number of columns in which data are simultaneously transferred is large, that is, when data are simultaneously transferred in most of the columns, the level of the potential signal for driving the latch type amplifying means can be prevented from being significantly lowered from the precharge potential VBL. As a result, the erroneous operation of the latch type amplifying means connected to a column in which data is not transferred (refresh column) can be prevented and a problem of data destruction in the refresh column caused by the erroneous operation of the latch type amplifying means can be eliminated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram for illustrating the flow of the operation of a DRAM with data latch;

FIG. 7 is a block diagram showing a main portion of a data write/readout section of a data latch DRAM according to a first embodiment of this invention;

FIG. 8 is a circuit diagram of a circuit attached to each column of FIG 7;

FIG. 9 is a block diagram showing the construction of a peripheral circuit section 30 shown in FIG. 7;

FIGS. 13A to 13C are circuit diagrams of a sense amplifier driver and precharger circuit shown in FIG. 7, FIG. 13A being a circuit diagram of a circuit 5-1, FIG. 13B being a circuit diagram of a circuit 5-2 and FIG. 13C being a circuit diagram of a circuit 5-3;

FIG. 16 is a cross sectional view taken along the 16—16 line of FIG. 15, for showing the structure of a memory cell according to the second embodiment; and FIG. 17 is a cross sectional view taken along the 17—17 line of FIG. 15, for showing the structure of a memory cell according to the second embodiment.

DETAILED DESCRIPTION OF THE PREFERRED EMBODIMENTS

Before explaining the embodiments of this invention, the mechanism which causes the erroneous operation of the sense amplifier at the time of simultaneous data transfer in the DRAM with data latch is explained in detail.

Figure 2:
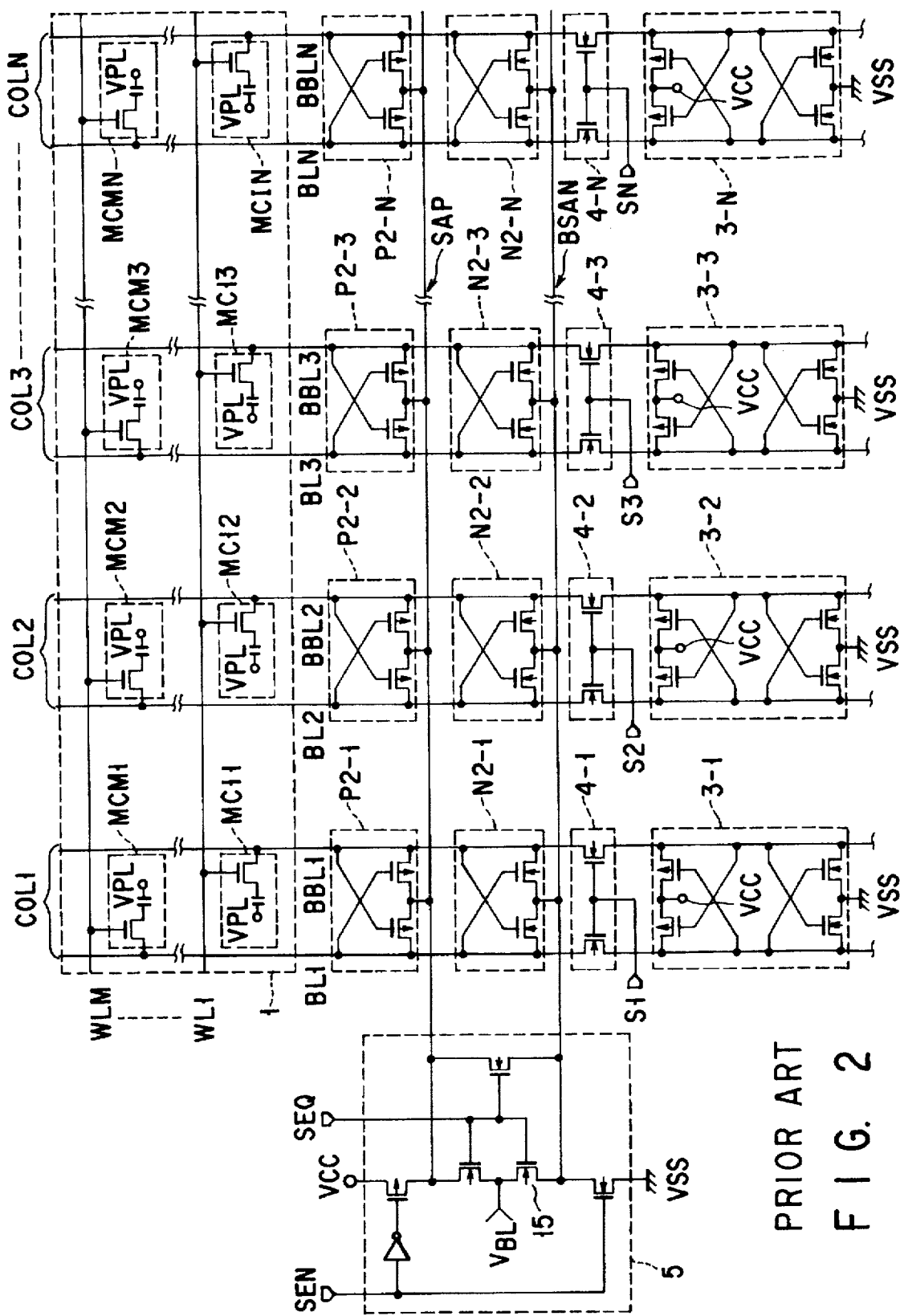
FIG. 2 is a circuit diagram of a data input/output section (write-readout section) of the conventional DRAM with data latch.

FIG. 2 is a diagram showing an example of the circuit connected between the DRAM cell array 110 and the data bus 120 in FIG. 1 and the driver and precharger circuit 127 constructed by use of the conventional technique. An area surrounded by broken lines and indicated by a reference numeral 1 is a memory cell array and memory cells MC11 to MCMN are arranged in a matrix form of M rows×N columns. Paired bit lines BL(1-N) and BBL(1-N) are arranged on each column in the memory cell array 1 and circuit groups provided for the respective bit line pairs are referred to as columns COL1 to COLN. The columns COL1 to COLN connect the memory cells MC11 to MCMN to the data bus 120 (not shown). A PMOS sense amplifier P2 (P2-1 to P2-N), an NMOS sense amplifier N2 (N2-1 to N2-N) and a data latch circuit 3 (3-1 to 3-N) are provided in each of the columns between the memory cell array 1 and the data bus 120 (not shown). The construction is similar to a Cache DRAM in which the cache portion has a data latch circuit of one row×N columns. Further, a transfer gate 4 (4-1 to 4-N) for connecting the data latch circuit 3 to the memory cells MC in response to a corresponding one of transfer gate selections signal S1 to SN is provided on each column between the NMOS sense amplifier N2 and the data latch circuit 3. The memory cells of the memory cell array 1 on the same row are connected to a corresponding one of the word lines WL1 to WLM.

A circuit indicated by a reference numeral 5 is a sense amplifier driver and precharger circuit disposed outside the memory cell array 1 and the circuit supplies driving signals SAP, BSAN for the sense amplifier and a precharge voltage VBL. An equalizing signal SEQ and a sense amplifier activation signal SEN are supplied from a row controller 123 of FIG. 1.

Next, the data destruction phenomenon is explained in detail with reference to the accompanying drawing. In this explanation, the number of columns which are contained in the N columns and in which data are simultaneously transferred from the data latch circuits 3 via the respective transfer gates 4 is set to P.

First, a case wherein the number P of the data-transfer columns is small and the sense amplifier is correctly operated is explained.

Figure 3:
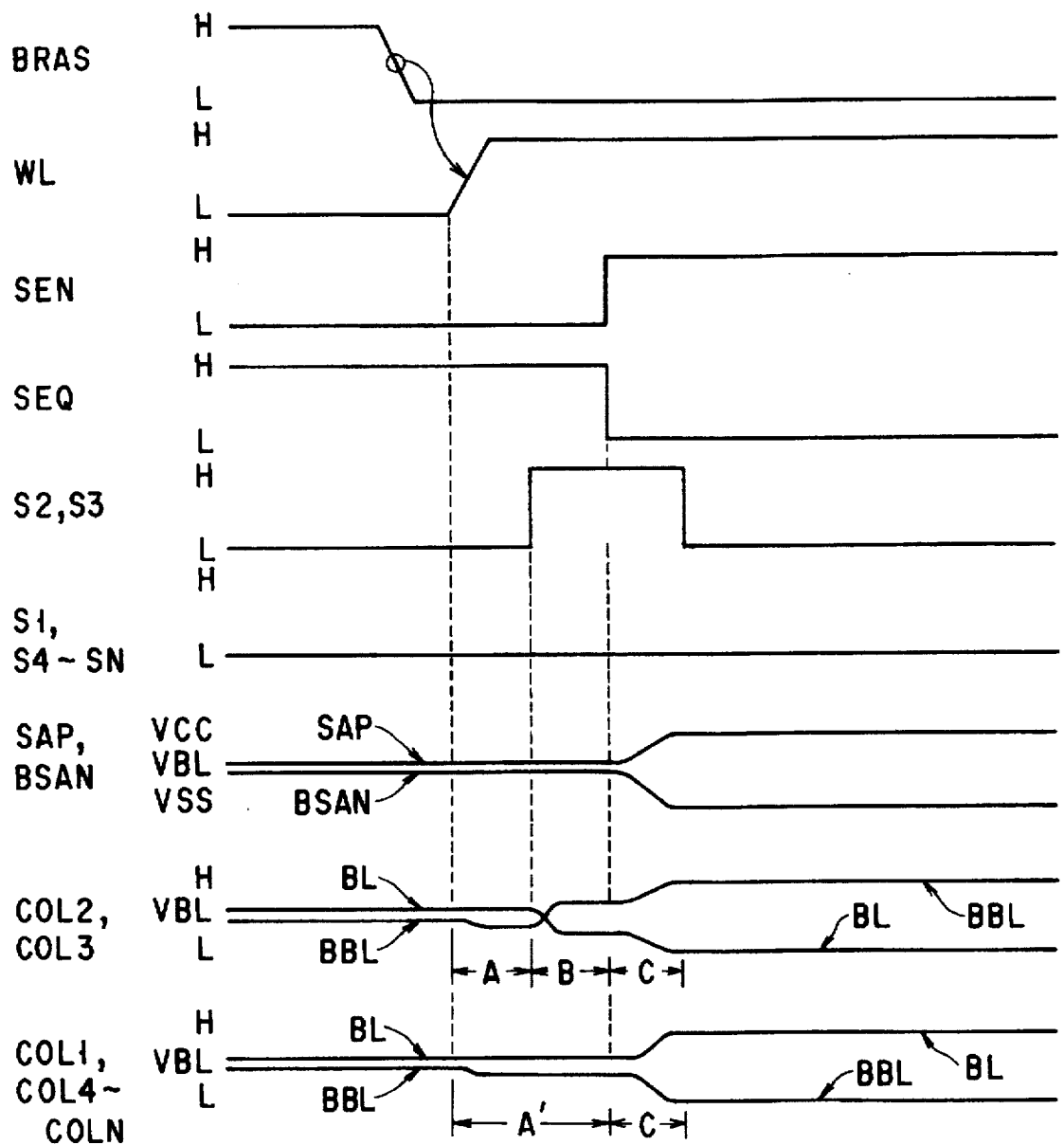
FIG. 3 is an operation waveform diagram showing waveforms obtained in a case where the number of the columns of data to be simultaneously transferred in the circuit of FIG. 2 is two and the data rewriting operation is correctly performed.

FIG. 3 is an operation waveform diagram for illustrating the operation performed when the number P of the columns in which simultaneous data transfer is performed is set to 2. In this example, it is supposed that simultaneous data transfer is performed only in the columns COL2, COL3 and no data transfer is performed in the remaining columns COL1, COL4 to COLN.

As shown in FIG. 3, the row address strobe signal BRAS first falls. In response to the fall of the signal, the potential of the word line WL selected by a row address input (not shown) is set to the "H" level (the "H" level is a boosted word line potential VPP, for example) and the word line WL is activated. When the word line WL is activated, one of the potentials of the bit lines BL and BBL in each of the columns COL1 to COLN is lowered according to data stored in the memory cell and thus a small potential difference occurs between the bit lines BL and BBL (in a period indicated by a reference symbol A in FIG. 3).

Next, in order to set only the transfer gates 4-2, 4-3 on the columns COL2, COL3 in which simultaneous data transfer is performed among the transfer gates 4-1 to 4-N into the conductive state, only the transfer gate selection signals S2, S3 are activated. In response to the activated signals, the transfer gates 4-2, 4-3 are made conductive. Data items stored in the data latches 3-2, 3-3 are transferred to the respective columns COL2, COL3 via the transfer gates 4-2, 4-3. If the data is thus transferred, the relation between the potentials of the bit lines BL2 and BBL2 constructing the column COL2 is inverted. Likewise, the relation between the potentials of the bit lines BL3 and BBL3 constructing the column COL3 is inverted. Thus, if the relation between the potentials of the bit lines BL and BBL is inverted, new data are written in place of data which has been stored in the memory cell MC (in a period indicated by a reference symbol B in FIG. 3).

At this time, in the columns COL1, COL4 to COLN in which no data transfer is performed, none of the transfer gates 4-1, 4-4 to 4-N are made conductive. Therefore, the relation between the potentials of the bit lines BL2 and BBL2 determined by data stored in the memory cell MC is maintained (in a period indicated by a reference symbol A' in FIG. 3).

Figure 4:
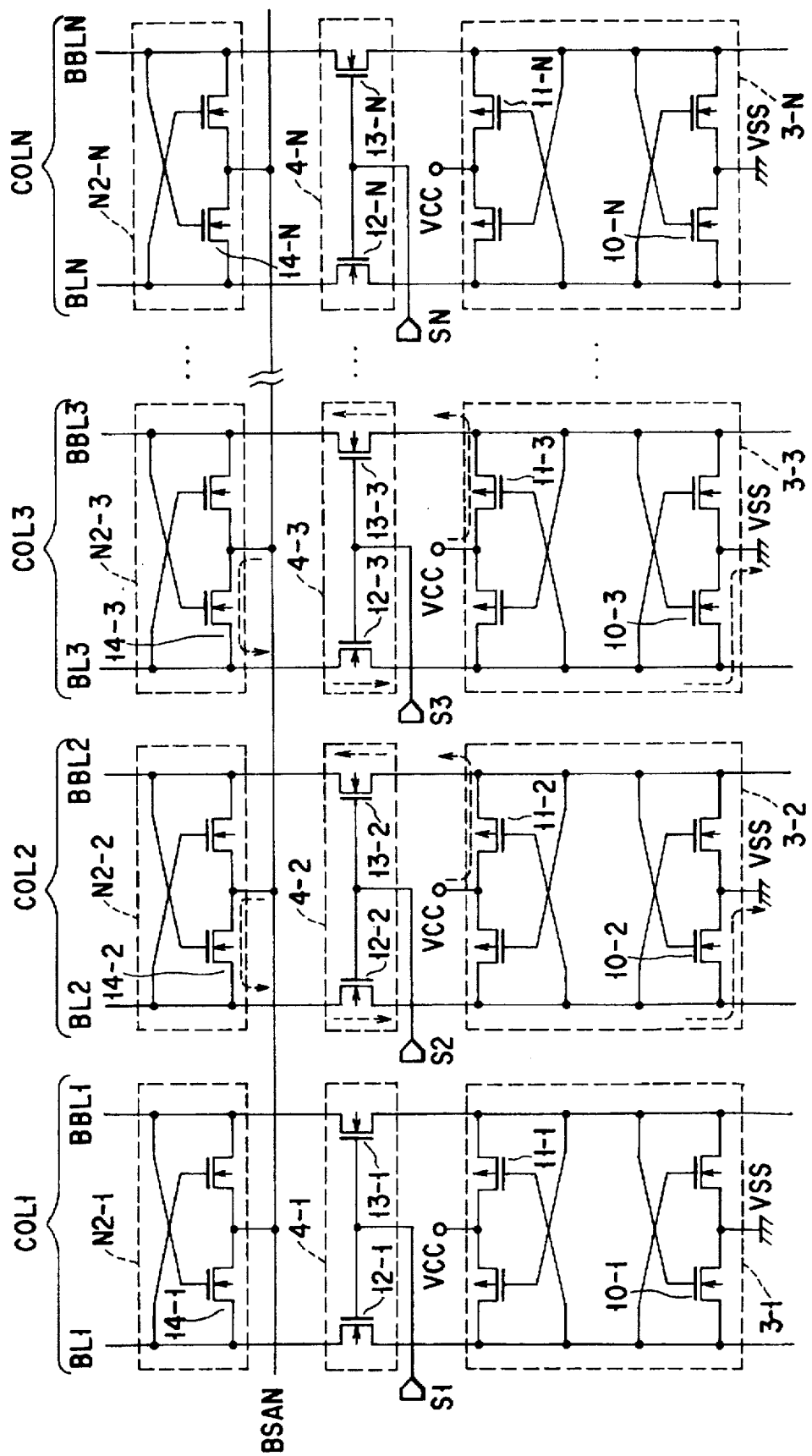
FIG. 4 is a diagram showing the operation state of the circuit at the time of simultaneous data transfer in the operation of FIG. 3.

FIG. 4 is a diagram specifically showing the operation state of the circuit when the transfer gates 4-2, 4-3 are set into the conductive state, that is, at the time of simultaneous data transfer in the above operation sequence.

In this example, it is supposed that an N-channel MOSFET (which is hereinafter simply referred to as NMOS) 10-2 contained in the data latch circuit 3-2 and an NMOS 10-3 contained in the data latch circuit 3-3 are rendered conductive in response to supply of data from the data bus 120 (not shown). Likewise, it is supposed that a P-channel MOSFET (which is hereinafter simply referred to as PMOS) 11-2 contained in the data latch circuit 3-2 and a PMOS 11-3 contained in the data latch circuit 3-3 are rendered conductive in response to supply of data. It is supposed that if NMOSs 12-2, 12-3 and NMOSs 13-2, 13-3 constructing the transfer gates 4-2, 4-3 are made conductive in this state, the potentials of the bit lines BBL2, BBL3 are driven towards the high potential VCC and the potentials of the bit lines BL2, BL3 are driven towards the low potential VSS. If the potential difference between the paired bit lines BL2 and BBL2 and the potential difference between the paired bit lines BL3 and BBL3 become higher than the respective threshold voltages Vth of the NMOSs 14-2, 14-3 contained in the NMOS sense amplifiers N2-2, N2-3, the NMOSs 14-2, 14-3 are rendered conductive. When the NMOSs 14-2, 14-3 are rendered conductive, the potential of a driving signal line BSAN is driven towards the low potential VSS. However, at this time, the sense amplifier equalizing signal SEQ is set at the "H" level as shown in the operation waveform diagram of FIG. 3. Therefore, an NMOS 15 functioning as the BSAN precharger contained in the drive and precharge circuit 5 shown in FIG. 2 is set in the ON state. Since the NMOS 15 is formed with relatively large dimensions, the current driving ability thereof is larger than those of the two NMOSs, that is, the NMOSs 14-2, 14-3. Therefore, even when both of the NMOSs 14-2, 14-3 are turned ON, the potential of the driving signal line BSAN will not be significantly lowered from the precharge potential VBL.

After this, the sense amplifier equalizing signal SEQ is inactivated and the sense amplifier activation signal SEN is activated. Then, the potential of the driving signal line SAP is raised towards the high potential VCC from the precharge potential VBL by the sense amplifier driver and precharger circuit 5 and the potential of the driving signal line BSAN is lowered towards the low potential VSS from the precharge potential VBL. As a result, the sense amplifiers N2-1 to N2-N, P2-1 to P2-N are activated. If the sense amplifiers are activated, the potential differences between the bit lines BL and BBL in the respective columns COL1 to COLN are amplified. The amplified potential difference is written into the memory cell MC which is connected to the bit lines BL, BBL and whose gate is connected to the word line WL set at the "H" level as new data and refreshed data.

However, if the number P of the transfer columns is large, that is, when simultaneous data transfer is performed in most of the columns, the following problem may occur.

Figure 5:
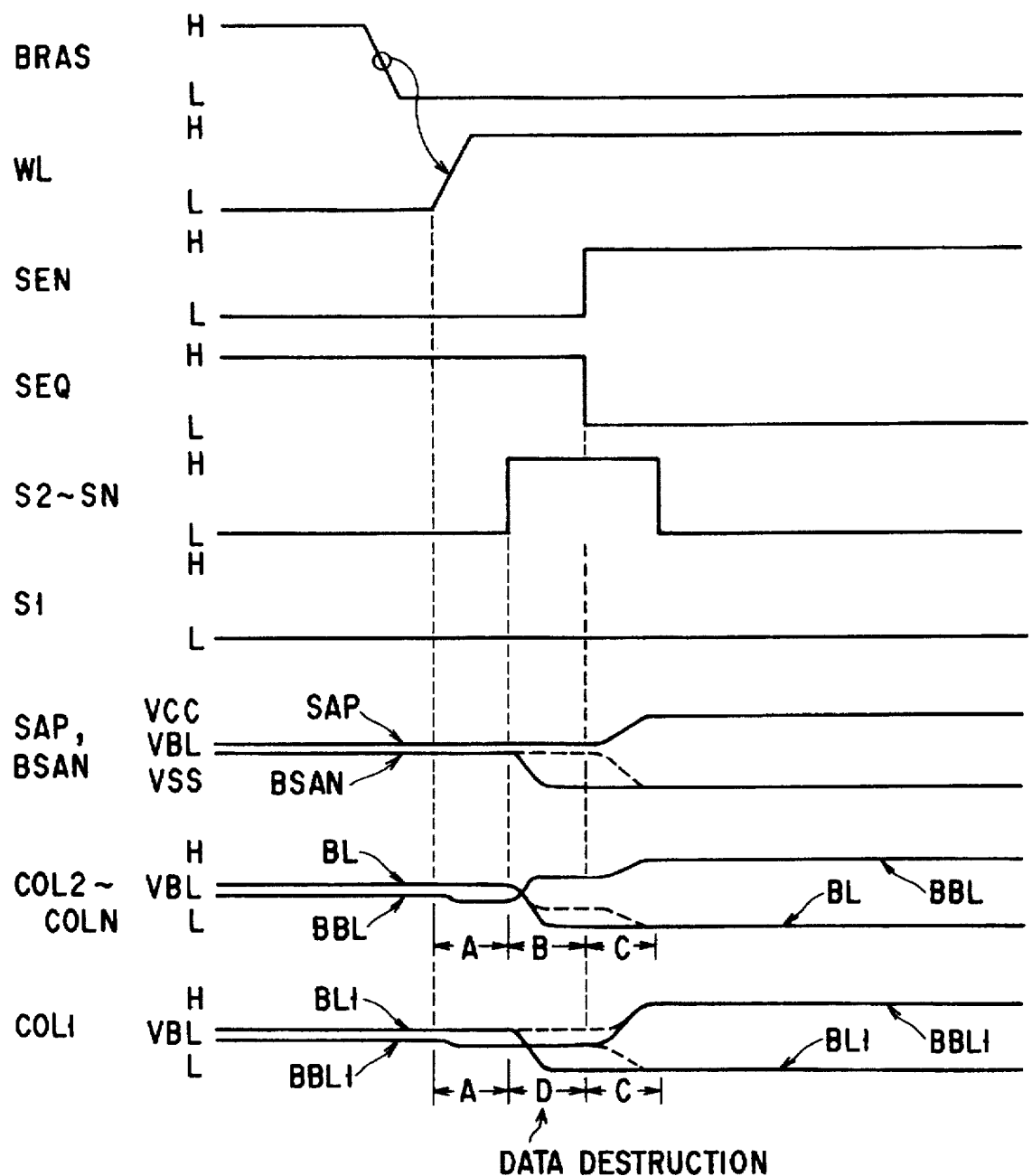
FIG. 5 is an operation waveform diagram showing waveforms obtained in a case where simultaneous data transfer is performed in the columns except COL1, for illustrating a state in which data destruction occurs.

FIG. 5 is an operation waveform diagram for illustrating the operation performed when the number P of the columns in which simultaneous data transfer is performed is (N–1). In this example, no data transfer is performed only in the column COL1 and simultaneous data transfer is performed in the remaining columns COL2 to COLN.

The operation waveform of FIG. 5 is different from that of FIG. 3 in the potential of the driving signal line BSAN set after activation of the transfer gate selection signal S and in the waveforms of the potentials of the bit lines BL1, BBL1 of the column COL1 in which no data transfer is performed.

Figure 6:
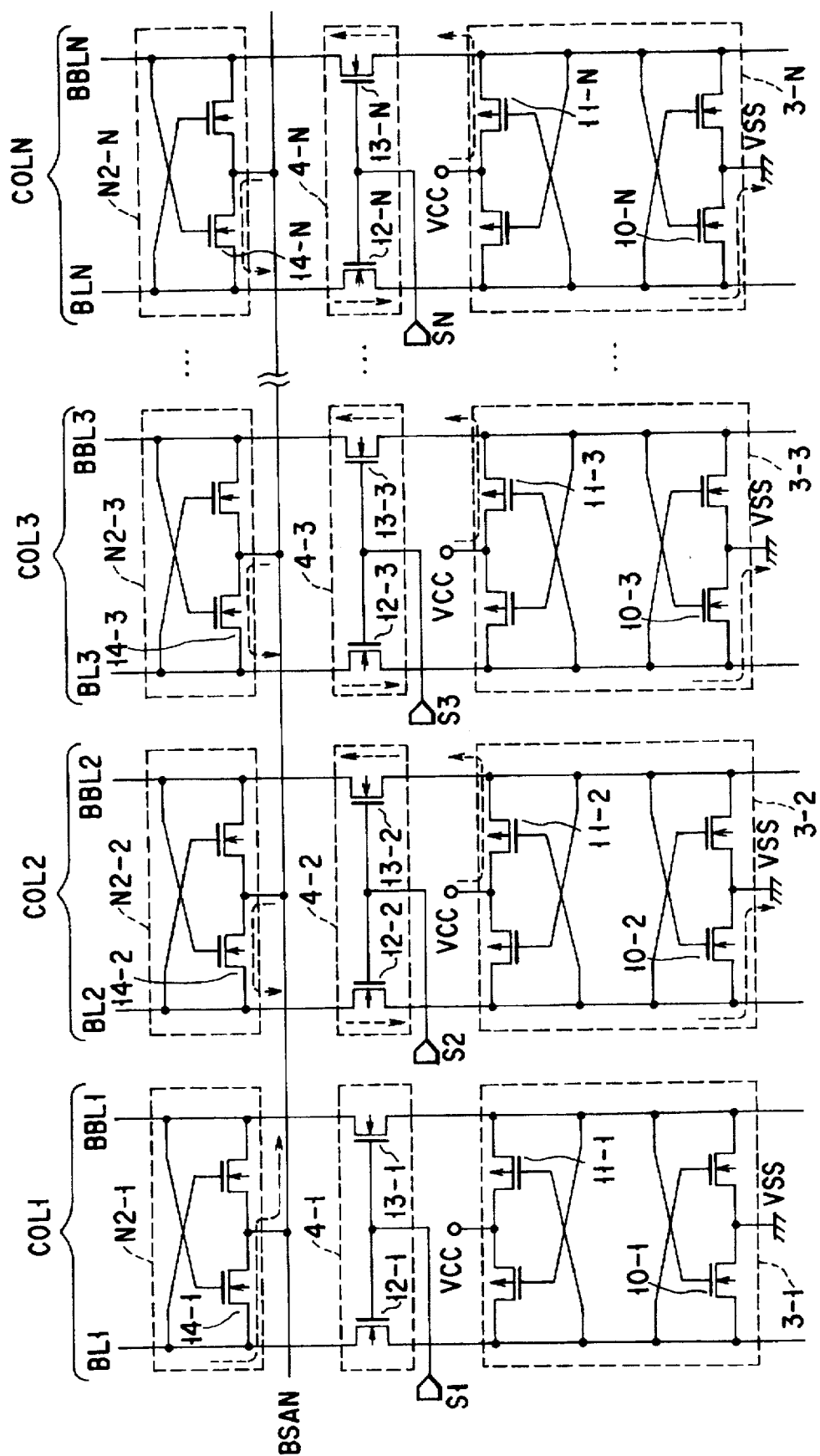
FIG. 6 is a diagram showing the operation state of the circuit at the time of simultaneous data transfer in the operation of FIG. 5.

FIG. 6 is a diagram specifically showing the operation state of the circuit at the time of simultaneous data transfer in FIG. 5.

In the column in which data is transferred, the NMOS 10 contained in the data latch circuit 3 drives the bit line BL towards the low potential VSS and the NMOS 14 contained in the NMOS sense amplifier N2 is made conductive. This is the same as in the case described with reference to FIG. 4. As shown in FIG. 6, if the number of NMOSs 14 to be rendered conductive increases, the potential of the drive signal line BSAN is gradually lowered from the precharge potential VBL to the low potential VSS after the select signals S are simultaneously activated even if the NMOS 15 contained in the drive and precharge circuit 5 shown in FIG. 2 is set in the ON state, for example. This is because the NMOS 15 has no ability of supplying driving currents of (N–1) NMOSs 14. Even if the potential of the drive signal line BSAN is lowered to the low potential VSS, no influence is given to the operation of the columns in which the data are transferred. However, if the potential of the drive signal line BSAN is lowered to the low potential VSS, the NMOS sense amplifier N2-1 will be erroneously operated. Specifically, if the potential of the drive signal line BSAN falls before the read-out data from the memory cell sufficiently develops on the bit line pair BL1 and BBL1 in the column COL1 wherein the data stored in the cell should be refreshed, the data read out on the bit line pair BL1 and BBL1 is destroyed due to the noise. If, in this state, the sense amplifiers N2, P2 are simultaneously activated, the inverted data is amplified in the column COL1 as shown in a period C and then written into the memory cell MC.

Embodiments of this invention which solve the above problem are explained below.

(Embodiment 1)

The schematic whole construction diagram of a DRAM with data latch of this invention is the same as that shown in FIG. 1. FIG. 7 is a block diagram showing the whole construction of a data input/output system of a dynamic RAM according to a first embodiment of this invention and shows a characteristic portion of this invention. FIG. 8 is a circuit diagram of memory cells, sense amplifiers, transfer gates and data latch circuits in the block diagram of FIG. 7.

As shown in FIG. 7, a memory cell array 1 having memory cells MC11 to MCMN of M rows×N columns integrated therein is formed on the chip. Each of the memory cells MC11 to MCMN is constructed as a dynamic memory cell including one transfer transistor and one capacitor. The memory cell array 1 is divided into a plurality of blocks in the array. In this embodiment, the memory cell array is divided into two blocks B1, B2. Columns (bit line pairs) COL1 to COLN are provided in the memory cell array 1. Among the above columns, the columns COL1 to COLi are arranged in the block B1 and the columns COLi+1 to COLN are arranged in the block B2. The columns COL1 to COLN connect the memory cells MC11 to MCMN to a data bus 20. For example, the number N of the columns is set to 128 and the number i of the columns arranged in one block is set to 64.

A sense amplifier group 21-1 is provided in the columns COL1 to COLi between the block B1 and the data bus 20 and a sense amplifier group 21-2 is provided in the columns COLi+1 to COLN between the block B2 and the data bus 20. The sense amplifier group 21-1 includes sense amplifiers 2-1 to 2-i respectively connected to the columns COL1 to COLi. Likewise, the sense amplifier group 21-2 includes sense amplifiers 2-i+1 to 2-N respectively connected to the columns COLi+1 to COLN. As shown in FIG. 8, each of the sense amplifiers 2-1 to 2-N is constructed by a CMOS cross-coupled latch circuit including a cross-coupled PMOS sense amplifier P2 and a cross-coupled NMOS sense amplifier N2.

The PMOS sense amplifiers P2-1 to P2-N are connected to a drive signal line SAP. The potential of the drive signal line SAP is supplied from a driver and precharger circuit 5-1 arranged in an area near one end portion of the memory cell array 1 and a driver and precharger circuit 5-2 arranged in an area near the other end portion thereof. Among the NMOS sense amplifiers N2-1 to N2-N, the NMOS sense amplifiers N2-1 to N2-i are connected to a drive signal line BSAN1. The potential of the drive signal line BSAN1 is supplied from the driver and precharger circuit 5-1 arranged in the area near one end portion of the memory cell array 1 and a driver and precharger circuit 5-3 arranged in an area between the sense amplifier groups 21-1 and 21-2. Further, the NMOS sense amplifiers N2-i+1 to N2-N are connected to a drive signal line BSAN2. The potential of the drive signal line BSAN2 is supplied from the driver and precharger circuit 5-3 arranged in the area between the sense amplifier groups 21-1 and 21-2 and the driver and precharger circuit 5-2 arranged in the area near the other end portion of the memory cell array 1.

A data latch circuit group 3 is provided in the columns COL1 to COLN between the sense amplifiers 2-1 to 2-N and the data bus 20. The data latch circuit group 3 includes data latch circuits 3-1 to 3-N respectively connected to the columns COL1 to COLN. As shown in FIG. 8, the data latch circuits 3-1 to 3-N are constructed by cross-coupled latch circuits which are respectively similar to the sense amplifiers 2-1 to 2-N. A cross-coupled PMOS portion of each of the data latch circuits 3-1 to 3-N supplies the high potential VCC to one of the bit lines BL and BBL and a cross-coupled NMOS portion thereof supplies the low potential VSS to the other of the bit lines BL and BBL.

A transfer gate group 4 for connecting the data latch circuits 3-1 to 3-N to the memory cells MC in response to the transfer gate selection signals S1 to SN generated from a peripheral circuit portion 30 is provided in the columns COL1 to COLN between the sense amplifiers 2-1 to 2-N and the data latch circuits 3-1 to 3-N. The transfer gate group 4 includes transfer gates 4-1 to 4-N respectively connected to the columns COL1 to COLN. As shown in FIG. 8, each of the transfer gates 4-1 to 4-N includes an NMOS 12 serially inserted in a corresponding one of the bit lines BL and an NMOS 13 serially inserted in a corresponding one of the bit lines BBL. The gate of the NMOS 12 and the gate of the NMOS 13 are connected to each other and the commonly connected gates are supplied with a corresponding one of the transfer gate selection signals S1 to SN for each of the columns COL1 to COLN.

A column gate group 22 for selecting a column to be activated according to column selection signals CSL1 to CSLN generated from the peripheral circuit portion 30 is provided in the columns COL1 to COLN between the data latch circuits 3-1 to 3-N and the data bus 20. The column gate group 22 includes column gates 22-1 to 22-N respectively connected to the columns COL1 to COLN. Each of the column gates 22-1 to 22-N can be constructed by a circuit exactly the same as the transfer gate 4.

The data bus 20 is connected to an I/O buffer 23 which is in turn connected to an external I/O bus 24 disposed outside the chip. The I/O buffer 23 is used to transfer data from the external I/O bus 24 to the data bus 20 and from the data bus 20 to the external I/O bus 24.

Next, the operation of the DRAM according to the first embodiment is explained.

Figure 10:
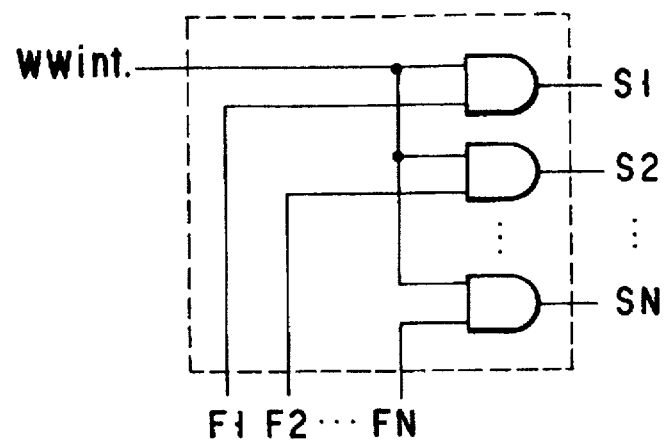
FIG. 10 is a circuit diagram of a transfer gate selector shown in FIG. 9.
Figure 11:
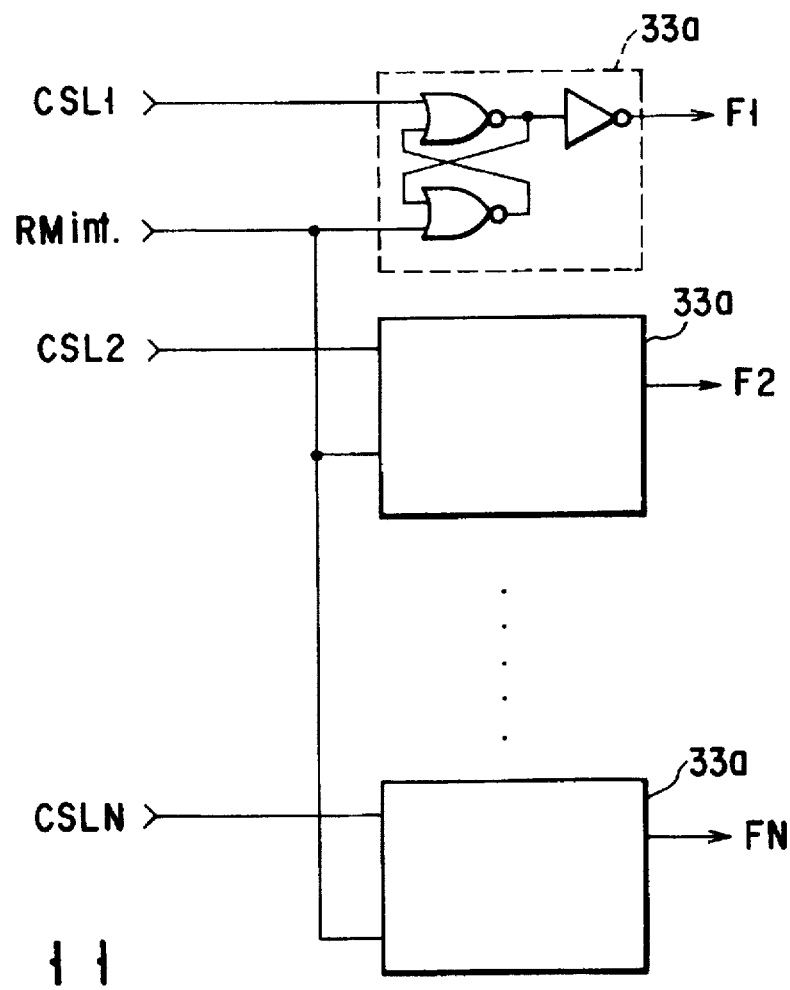
FIG. 11 is a circuit diagram of a write flag register shown in FIG. 9.
Figure 12:
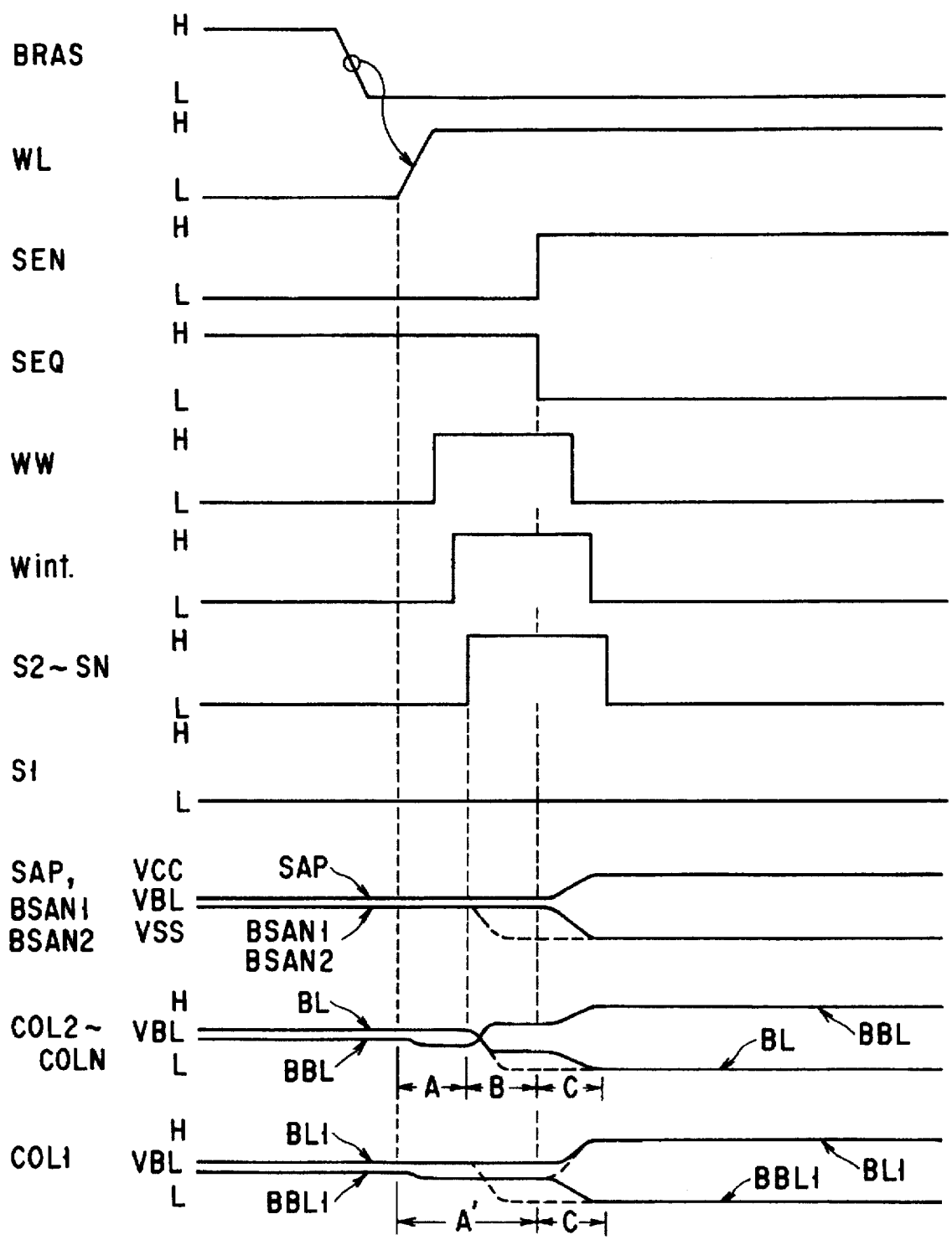
FIG. 12 is a waveform diagram showing operation waveforms of a dynamic RAM according to a first embodiment of this invention.

FIG. 9 is a block diagram showing the construction of the peripheral circuit section 30 shown in FIG. 8, FIG. 10 is a circuit diagram of the transfer gate selector shown in FIG. 9, and FIG. 11 is a circuit diagram of the write flag register shown in FIG. 9. FIG. 12 is an operation waveform diagram showing operation waveforms of the DRAM according to the first embodiment of this invention.

First, the operation of writing data of one row is performed for the data latch circuit group 3. Data is input from the external I/O bus 24 shown in FIG. 7 to the data bus 20 via the I/O buffer 23. Then, a column address signal CADD is input from the exterior of the chip to a column address buffer 31 shown in FIG. 9. Next, a column address strobe signal BCAS is input to the column address buffer 31 via a column controller 311 and the input column address CADD is fetched into the chip. The column address buffer 31 causes the column address CADD to be input to a column decoder 32 in response to input of a signal BCASint. The column decoder 32 outputs a selected one of the column select signals CSL1 to CSLN in response to the column address CADD. The output column select signal CSL is supplied to one of the column gates 22-1 to 22-N. The column gate which has received the column select signal CSL is activated. One of the data latch circuits 3-1 to 3-N which is connected to the activated column gate is connected to the data bus 20. Data input to the data bus 20 is written into the data latch circuit which is connected to the data bus 20. The data writing operation is performed with all of the transfer gates 4-1 to 4-N kept in the OFF state.

In the DRAM according to this embodiment, the operation of writing data into the data latch circuit is performed only for the column in which the data rewriting operation is performed. Therefore, in order to determine one of the data latch circuits 3-1 to 3-N into which data is written, a write flag register 33 and a transfer gate selector 39 are provided in the peripheral circuit section 30 in the DRAM according to this embodiment.

The write flag register 33 receives an output from the column decoder 32 and outputs write flag signals F1 to FN corresponding to the columns COL1 to COLN. The write flag signals F1 to FN are binary signals indicating that data has been written or not, and when data has been written, the signal is set to the "H" level, and when data has not been written, the signal is set to the "L" level, for example. In this example, it is supposed that no simultaneous data transfer is performed only for the column COL1 (which is hereinafter referred to as a refresh column) and simultaneous data transfer is performed for all of the other columns COL2 to COLN. In this supposed state, only the flag signal F1 corresponding to the column COL1 is set at the "L" level and all of the other flag signals F2 to FN are set at the "H" level in the flag register 33. In FIG. 11, RMint is a reset signal and is obtained by inputting a reset signal RM supplied from the exterior to an RM buffer 40 as shown in FIG. 9. RMint is set to "H" by setting the external signal RM to "H", and as a result, those of F1 to FN which are set at "H" are all reset to "L" by a logic circuit 33a. Further, flag signals F1 to FN corresponding to signals CSL1 to CSLN from the column decoder 32 in FIG. 11 are output.

The transfer gate selector 39 is constructed as shown in FIG. 10 and derives the logical ANDs of a transfer gate control signal WWint input from the exterior and supplied via the WW buffer 38 and the flag signals F1 to FN to output transfer gate control signals S1 to SN.

The write operation to the data latch circuits is performed until the operation of writing data of one row is completed while changing write data and input column address CADD. When writing of data of one row for the data latch circuit group 3 is completed, the data are simultaneously transferred from the data latch circuits to the sense amplifiers 2 only in the columns in which data writing are performed.

In order to select a desired row in which data are stored, a row address RADD is input to a row address buffer 34 shown in FIG. 9. Next, as shown in the operation waveform diagram of FIGS. 9 and 12, a row address strobe signal BRAS is input to the row control circuit 35. The row address buffer 34 supplies an input row address RADD to a row decoder 36 in response to the signal BRASint generated by the row control circuit 35.

The row control circuit 35 drives a word line voltage booster circuit 37. The word line voltage booster circuit 37 supplies a voltage boosted potential VPP to the row decoder 36. The row decoder 36 selects one of the word lines WL1 to WLM according to the row address RADD and raises the potential of the selected word line WL to the voltage boosted potential VPP ("H" level). Thus, the word line WL is activated.

When the word line WL is activated, one of the potentials of the bit lines BL and BBL in each of the columns COL1 to COLN is lowered according to data stored in the memory cell MC and thus a small potential difference occurs between the bit lines BL and BBL in a period indicated by a reference symbol A in FIG. 12.

Then, a transfer gate activation signal WW is input to the WW buffer 38 shown in FIG. 9 from the exterior of the chip. The WW buffer 38 receives the WW transfer gate activation signal WW, buffers the received signal to an internal transfer gate activation signal WWint and outputs the buffered signal. The internal transfer gate activation signal WWint is input to the transfer gate selector 39. As described before, the selector 39 derives and outputs the logical ANDs of the signal levels of the write flag signals F1 to FN and the signal level of the internal transfer gate activation signal WWint. Outputs of the output logical ANDs are supplied as the transfer gate select signals S1 to SN.

The selector 39 sets the potentials of the select signals S1 to SN to the "H" level only when the potentials of the flag signals F1 to FN and the potential of the internal transfer gate activation signal WWint are all set at the "H" level. Therefore, only the select signal S1 is set at the "L" level and the other select signals S2 to SN are all set at the "H" level. As a result, the transfer gates 4-2 to 4-N are rendered conductive in the columns COL2 to COLN in which data writing has been performed. The data stored in the data latches 3-2 to 3-N are transferred to the columns COL2 to COLN via the transfer gates 4-2 to 4-N. When the data have been thus transferred, the relation between the potentials of the bit lines BL and BBL constructing the columns COL2 to COLN is inverted in the respective columns in a period indicated by a reference symbol B in FIG. 12.

At this time, in the column COL1 in which data is refreshed, the transfer gate is kept non-conductive. Therefore, the relation between the potentials of the bit lines BL1 and BBL1 determined by the data stored in the memory cell MC is kept unchanged.

Next, the potentials of the sense amplifier drive signal line pairs SAP, BSAN1 and BSAN2 are shifted from the precharge potential VBL to the VCC level and VSS level, respectively, by the divided sense amplifier driver and precharger circuits 5-1, 5-2 and 5-3. Thus, all of the NMOS sense amplifiers N2-1 to N2-N and PMOS sense amplifiers P2-1 to P2-N are activated.

By activation of the sense amplifiers, the new data are amplified in the columns COL2 to COLN as shown in a period indicated by a reference symbol C in FIG. 12. Then, the new data are written into the memory cells MC. Further, in the column COL1, the same operation as the refresh operation in the normal DRAM is performed and the data stored in the memory cell MC are amplified again in a period indicated by a reference symbol A' in FIG. 12. Then, refreshed data are written into the memory cell MC again.

Since the DRAM according to the first embodiment of this invention has the data latch circuits 3-1 to 3-N in the respective columns COL1 to COLN, it is possible to temporarily store data supplied from the data bus 20. Further, since the transfer gates 4-1 to 4-N which are rendered conductive in response to the transfer gate select signals S1 to SN are provided in the respective columns COL1 to COLN, it is possible to simultaneously transfer data from the latch circuits to corresponding columns only in the columns in which data has been rewritten.

In the DRAM according to the first embodiment, the memory cell array 1 is divided into the two blocks B1 and B2 while maintaining the function of simultaneously transferring data and keeping the construction capable of attaining the above function and the sense amplifier groups 21-1 and 21-2 are respectively provided for the divided blocks B1 and B2. Further, the sense amplifier driver and precharger circuit is divided into circuit sections for the respective divided sense amplifier groups 21-1 and 21-2.

In the example shown in FIGS. 7 and 8, the driver and precharger circuit is divided into the three circuits 5-1, 5-2 and 5-3. The divided driver and precharger circuits 5-1 to 5-3 are supplied with the same sense amplifier equalizing signal SEQ and sense amplifier activation signal SEN from the row control circuit 35 and the circuits 5-1 to 5-3 are operated in synchronism with the signals SEQ and SEN.

FIGS. 13A to 13C are circuit diagrams of the sense amplifier driver and precharger circuits shown in FIG. 7. FIG. 13A is a circuit diagram of the circuit 5-1, FIG. 13B is a circuit diagram of the circuit 5-2 and FIG. 13C is a circuit diagram of the circuit 5-3.

First, as shown in FIG. 13A, the sense amplifier driver and precharger circuit 5-1 arranged in an area near one end portion of the memory cell array 1 includes a SAP driver 41-1 which receives an activation signal SEN at the control terminal thereof and whose current path is connected to the high potential VCC at one end and connected to the drive signal line SAP at the other end, a SAP precharger 42-1 which receives an equalizing signal SEQ at the control terminal thereof and whose current path is connected to the precharge potential VBL (for example, VCC/2 level) at one end and connected to the drive signal line SAP at the other end, a BSAN1 driver 43-1 which receives an activation signal SEN at the control terminal thereof and whose current path is connected to the low potential VSS (for example, ground level) at one end and connected to the drive signal line BSAN1 at the other end, and a BSAN1 precharger 44-1 which receives an equalizing signal SEQ at the control terminal thereof and whose current path is connected to the precharge potential VBL at one end and connected to the drive signal line BSAN1 at the other end. Further, it includes a drive signal line pair equalizer 45-1 which receives the equalizing signal SEQ at the control terminal thereof and is serially connected between the drive signal lines SAP and BSAN1.

As the more concrete construction, the SAP driver 41-1 is constructed by a circuit including at least a PMOS P1-1 which receives an inverted signal of the activation signal SEN at the gate thereof and supplies the high potential VCC to the drive signal line SAP in response to the inverted signal. Likewise, the SAP precharger 42-1 is constructed by a circuit including at least an NMOS N1-1 which receives the equalizing signal SEQ at the gate thereof and supplies the precharge potential VBL to the drive signal line SAP in response to the received signal. Likewise, the BSAN1 driver 43-1 is constructed by a circuit including at least an NMOS N2-1 which receives the activation signal SEN at the gate thereof and supplies the low potential VSS to the drive signal line BSAN1 in response to the received signal. Likewise, the BSAN1 precharger 44-1 is constructed by a circuit including at least an NMOS N3-1 which receives the equalizing signal SEQ at the gate thereof and supplies the precharge potential VBL to the drive signal line BSAN1 in response to the received signal. Likewise, the drive signal line pair equalizer 45-1 is constructed by a circuit including at least an NMOS N4-1 which receives the equalizing signal SEQ at the gate thereof and short-circuits the drive signal line SAP to the drive signal line BSAN1 in response to the received signal.

Further, as shown in FIG. 13B, the sense amplifier driver and precharger circuit 5-2 arranged in an area near the other end portion of the memory cell array 1 is different from the circuit 5-1 shown in FIG. 13A only in the connected drive signal line BSAN2, and the construction of the remaining portion thereof is exactly the same as the construction of a corresponding portion of the latter circuit. Therefore, the same circuit portions are denoted by the same reference numerals and the explanation therefor is omitted.

As described above, the circuit 5-1 includes a circuit portion for controlling the drive signal line SAP, that is, the SAP driver 41-1 and SAP precharger 42-1, and a circuit portion for controlling the drive signal line BSAN1, that is, the BSAN1 driver 43-1 and BSAN1 precharger 44-1. Likewise, the circuit 5-2 includes a circuit portion for controlling the drive signal line SAP, that is, the SAP driver 41-2 and SAP precharger 42-2, and a circuit portion for controlling the drive signal line BSAN2, that is, the BSAN2 driver 43-2 and BSAN2 precharger 44-2.

On the other hand, as shown in FIG. 13C, the sense amplifier driver and precharger circuit 5-3 arranged between the sense amplifier groups 21-1 and 21-2 has the following construction. That is, the circuit 5-3 has no circuit portion for controlling the drive signal line SAP, and includes a circuit portion for controlling the drive signal line BSAN1 and a circuit portion for controlling the drive signal line BSAN2.

More specifically, the circuit 5-3 includes a BSAN1 driver 43-3 which receives an activation signal SEN at the control terminal thereof and whose current path is connected to the low potential VSS at one end and connected to the drive signal line BSAN1 at the other end, and a BSAN1 precharger 44-3 which receives an equalizing signal SEQ at the control terminal thereof and whose current path is connected to the precharge potential VBL at one end and connected to the drive signal line BSAN1 at the other end as the circuit portion for controlling the drive signal line BSAN1. Further, the circuit includes a BSAN2 driver 43-4 which receives the activation signal SEN at the control terminal thereof and whose current path is connected to the low potential VSS at one end and connected to the drive signal line BSAN2 at the other end, and a BSAN2 precharger 44-4 which receives the equalizing signal SEQ at the control terminal thereof and whose current path is connected to the precharge potential VBL at one end and connected to the drive signal line BSAN2 at the other end as the circuit portion for controlling the drive signal line BSAN2.

As the more concrete construction, the BSAN1 driver 43-3 is constructed by a circuit including at least an NMOS N2-3 which receives the activation signal SEN at the gate thereof and supplies the low potential VSS to the drive signal line BSAN1 in response to the received signal and the BSAN2 driver 43-4 is constructed by a circuit including at least an NMOS N2-4 which receives the activation signal SEN at the gate thereof and supplies the low potential VSS to the drive signal line BSAN2 in response to the received signal. Likewise, the BSAN1 precharger 44-3 is constructed by a circuit including at least an NMOS N3-3 which receives the equalizing signal SEQ at the gate thereof and supplies the precharge potential VBL to the drive signal line BSAN1 in response to the received signal and the BSAN2 precharger 44-4 is constructed by a circuit including at least an NMOS N3-4 which receives the equalizing signal SEQ at the gate thereof and supplies the precharge potential VBL to the drive signal line BSAN2 in response to the received signal.

Further, the circuit 5-3 includes a drive signal line pair equalizer 45-3 which receives the equalizing signal SEQ at the control terminal thereof and is serially connected between the drive signal lines SAP and BSAN1 in order to equalize the potentials of the drive signal lines SAP and BSAN1, and a drive signal line pair equalizer 45-4 which receives the equalizing signal SEQ at the control terminal thereof and is serially connected between the drive signal lines SAP and BSAN2 in order to equalize the potentials of the drive signal lines SAP and BSAN2.

As the more concrete construction, the drive signal line pair equalizer 45-3 is constructed by a circuit including at least an NMOS N4-3 which receives the equalizing signal SEQ at the gate thereof and short-circuits the drive signal line SAP to the drive signal line BSAN1. Likewise, the drive line pair equalizer 45-4 is constructed by a circuit including at least an NMOS N4-4 which receives the equalizing signal SEQ at the gate thereof and short-circuits the drive signal line SAP to the drive signal line BSAN2.

In the DRAM according to the first embodiment, the sense amplifier groups 21-1 and 21-2 are divided for the respective blocks B1 and B2 and the sense amplifier driver and precharger circuits 5-1 to 5-3 are provided for the blocks B1, B2. With this construction, as shown in the operation waveform diagram of FIG. 12, even when the number of columns in which data are simultaneously transferred is large, that is, when simultaneous data transfer is performed in most of the columns, the potentials of the drive signal lines BSAN1, BSAN2 can be prevented from being significantly lowered from the precharge potential VBL. This is because the load to be driven by one of the driver and precharge circuits 5-1 to 5-3 is alleviated.

If the potentials of the drive signal lines BSAN1, BSAN2 can be prevented from being significantly lowered from the precharge potential VBL, the erroneous operation of the sense amplifier 2 can be prevented. Therefore, a problem of data destruction in the refresh column caused by the erroneous operation of the sense amplifier 2 can be solved. Thus, it becomes possible to realize a DRAM in which destruction of data in the refresh column can be prevented by providing the driver and precharger circuits 5-1 to 5-3 for the blocks B1, B2.

In the DRAM of the first embodiment, the sense amplifier groups 21-1 and 21-2 are divided for the respective blocks B1 and B2, the sense amplifier driver and precharger circuits 5-1 to 5-3 are provided for the sense amplifier groups 21-1 and 21-2 which are divided for the respective blocks B1 and B2, and in addition, the drive signal line BSAN for supplying the power supply for operation to the NMOS sense amplifiers among the sense amplifiers is provided as the drive signal lines BSAN1 and BSAN2 and thus divided for the respective sense amplifier groups 21-1 and 21-2. By dividing the drive signal line BSAN into the drive signal lines BSAN1 and BSAN2 for the respective sense amplifier groups 21-1 and 21-2, it becomes possible to more effectively prevent the potential of the drive signal line BSAN from being lowered from the precharge potential to the low potential VSS at the time of simultaneous data transfer. This is because a potential drop in the drive signal line BSAN1 or BSAN2 caused in a block can be prevented from affecting the potential of the drive signal line BSAN2 or BSAN1 in the other block by dividing the drive signal line BSAN for the respective blocks.

Further, the drive signal line SAP for supplying the power supply for operation to the PMOS sense amplifiers among the sense amplifiers may be divided for the respective blocks, but in this embodiment, it is not divided. That is, a single drive signal line SAP is formed to extend from one end of the memory cell array 1 to the other end thereof and the circuits 5-1 and 5-2 respectively disposed near the two end portions of the memory cell array 1 are connected to simultaneously apply potentials to the drive signal line SAP. This construction can be realized based on the fact that the potential of the drive signal line SAP is hard to rise highly from the precharge potential VBL at the data transfer operation. That is, as shown in FIG. 8, by constructing the transfer gates 4-1 to 4-N by the NMOSs 12, 13, it becomes possible to generate a potential difference between the source and drain of the NMOS caused by the threshold voltage thereof. By the potential difference caused by the threshold voltage, the potential on the "H" level side of the bit line will not be raised to the high potential VCC level. Therefore, in the drive signal line SAP, the range of a rise of the potential from the precharge potential VBL is reduced and the PMOS sense amplifier among the sense amplifiers can be prevented from being erroneously operated even if a single drive signal line SAP is formed to extend from one end of the memory cell array 1 including a relatively large number of columns to the other end thereof.

Further, if a circuit portion for controlling the drive signal line SAP is disposed in an area between the sense amplifier groups, it becomes necessary to provide a circuit including at least a PMOS for supplying the high potential VCC to the drive signal line SAP in the above area. However, it becomes unnecessary to form the PMOS by removing a circuit portion for controlling the drive signal line SAP from the circuit 5-3 disposed in the area between the sense amplifier groups. That is, by forming the circuit 5-3 in a form without PMOS, it becomes unnecessary to form a well region in the area between the sense amplifiers formed in the substrate. Therefore, the DRAM can be formed with a higher integration density while the possibility of erroneous operation is reduced by constructing the transfer gates of the NMOSs 12, 13 without dividing the drive signal line SAP.

Further, if the equalizers 45-3 and 45-4 are provided also in the circuit 5-3 disposed in the area between the sense amplifier groups 21-1 and 21-2, it becomes possible to prevent the potentials of the drive signal lines BSAN1, BSAN2 from being easily lowered from the precharge potential VBL in the same manner as described above. This is because the potentials of the drive signal lines BSAN1 and SAP can be equalized by use of two equalizers, that is, the equalizer 45-1 provided in the circuit 5-1 and the equalizer 45-3 provided in the circuit 5-3 and connected in parallel with the equalizer 45-1. Also, this is because the potentials of the drive signal lines BSAN2 and SAP can be equalized by use of two equalizers, that is, the equalizer 45-2 provided in the circuit 5-2 and the equalizer 45-4 provided in the circuit 5-3 and connected in parallel with the equalizer 45-2.

Further, in the DRAM of the first embodiment, not only the effect that destruction of refresh cell data by the interference between the columns can be prevented but also the effect that switchings of activation and deactivation of the sense amplifiers 2-1 to 2-N can be rapidly performed can be attained. That is, by not only distributing the sense amplifier driver and precharger circuits in the respective blocks but also dividing the drive signal line, the capacitance of the load driven by the BSAN1 driver and precharger circuit and the BSAN2 driver and precharger can be reduced. Therefore, the delay amounts in the drive signal lines BSAN1 and BSAN2 can be reduced. If the delay amounts in the drive signal lines are thus reduced, the potentials of the drive signal lines BSAN1 and BSAN2 can be rapidly shifted from the precharge potential VBL to the low potential VSS and from the low potential VSS to the precharge potential VBL. If the potentials of the drive signal lines BSAN1 and BSAN2 can be rapidly shifted, switching of activation and deactivation of the sense amplifiers 2-1 to 2-N can be performed at high speed.

Further, in the above first embodiment, the number of block divisions is set to 2, but if the number of divisions is set to a larger number and the number i of columns contained in the block is reduced, destruction of refresh cell data by the interference between the columns via the drive signal line BSAN can be more stably prevented. The reason for this is explained in detail below.

As described before, the possibility of destruction of cell data by the interference between the columns becomes strong when simultaneous data transfer is performed in most of the N columns. Particularly, the strongest possibility of destruction of cell data will occur when only one refresh column is present. In the operation waveform diagram of FIG. 12, a state in which the column COL1 is set as only one refresh column and in which destruction of cell data tends to occur is shown.

In this state, the potential of the drive signal line BSAN1 is determined by the potential setting actions of the (i−1) sense amplifier NMOSs 14-2 to 14-i which act to set the above potential towards the low potential VSS and the two precharger NMOSs N3-1, N3-2 which act to set the above potential towards the precharge potential VBL.

In this case, it is assumed that deviation of the potential of the drive signal line BSAN1 from the precharge potential VBL (in this example, VCC/2) is small, the NMOSs 14-2 to 14-i are operated in the pentode operation mode and the precharger NMOSs N3-1, N3-2 are operated in the triode operation mode. Further, it is supposed that the potential of the bit line BL is set at the low potential VSS and the potential of the bit line BBL is set at the precharge potential VBL (VCC/2).

$$2\beta \left( V_{GS-PRCH} - V_{th} - \frac{1}{2} V_{DS-PRCH} \right) V_{DS-PRCH} = \qquad (1)$$

$$(i-1) \cdot \frac{\beta}{2} (V_{GS-NSA} - V_{th})^2$$

where $\beta$ is the differential conductance of the NMOS, $V_{th}$ is the threshold voltage of the NMOS, VGS-PRCH is a voltage between the gate and source of the precharge NMOS, VDS-PRCH is a voltage between the drain and source of the precharge NMOS, and VGS-NSA is a voltage between the gate and source of the NMOS of the sense amplifier.

From the above equation (1), the following equation (2) can be derived.

$$2\left\{ VCC - V_{BSAN} - V_{th} - \frac{1}{2}\left( \frac{1}{2} VCC - V_{BSAN} \right) \right\}. \quad (2)$$

$$\left( \frac{1}{2} VCC - V_{BSAN} \right) = \frac{i-1}{2} \cdot \left( \frac{1}{2} VCC - V_{th} \right)^2$$

The equation (2) can be rewritten as follows by setting $V_{BSAN} = \{(Vcc/2) - \Delta VC\}$.

$$2\left\{ VCC - \left( \frac{1}{2} VCC - \Delta VC \right) - V_{th} - \frac{1}{2}\left( \frac{1}{2} VCC - \frac{1}{2} VCC + \Delta VC \right) \right\}. \quad (3)$$

$$\left( \frac{1}{2} VCC - \frac{1}{2} VCC + \Delta VC \right) = \frac{i-1}{2} \cdot \left( \frac{1}{2} VCC - V_{th} \right)^2$$

By setting $\{(Vcc/2) - V_{th}\}$ to $C\phi$ ($C\phi$ is a constant) in the equation (3), the following equation (4) can be obtained.

$$2\left( \frac{1}{2} \Delta VC + C\phi \right) \Delta VC = \frac{i-1}{2} C\phi^2 \quad (4)$$

$\Delta VC$ can be derived as a function of i as follows by solving the equation (4).

$$\Delta VC = f(i) \quad (5)$$

In the equation (5), the right side is normally a monotone increasing function for i if $C\phi > 0$.

Next, the condition that the NMOS 14 of the NMOS sense amplifier N2 of the refresh column is rendered conductive when the potential VBSAN of the drive signal line BSAN is lowered from the precharge potential VBL (=VCC/2) by $\Delta VC$ expressed by the equation (5) can be expressed as follows.

$$\Delta VC > V_{th} \quad (6)$$

Therefore, when the relation between the equation (5) and the expression (6) and the fact that the function f(i) is a monotone increasing function for i are taken into consideration, the NMOS 14 of the NMOS sense amplifier N2 of the refresh column will not be rendered conductive if the maximum value of "i" which satisfies the following expression (7) is set to "I" and the number L (=N/i) of divisions of the array 1 is set to satisfy the condition that i≦L.

$$V_{th} \geq f(i) \quad (7)$$

In the DRAM of the first embodiment, the number L of divisions is set to 2, but in the actual applications, as indicated by (1) to (7), the interference between the columns can be sufficiently suppressed and the possibility that the refresh cell data will be destroyed can be suppressed to minimum by increasing the number L of divisions and reducing i.

Based on the above fact, another example of the block division can be provided in which the number N of columns is 256, the number L of divisions is 16, and the number i of columns to be provided in one block is 16. In this case, the number i of columns to be provided in one block is not necessarily uniform for all of the blocks. The number i of columns to be provided in one block may be set to a desired value for each block if the number i is set to satisfy the following equation (8).

$$\sum_{a=1}^{L} i_a = N \quad (8)$$

where L is equal to or larger than 2 and ia is the number of columns to be freely set in an a-th block.

(Embodiment 2)

Figure 14:
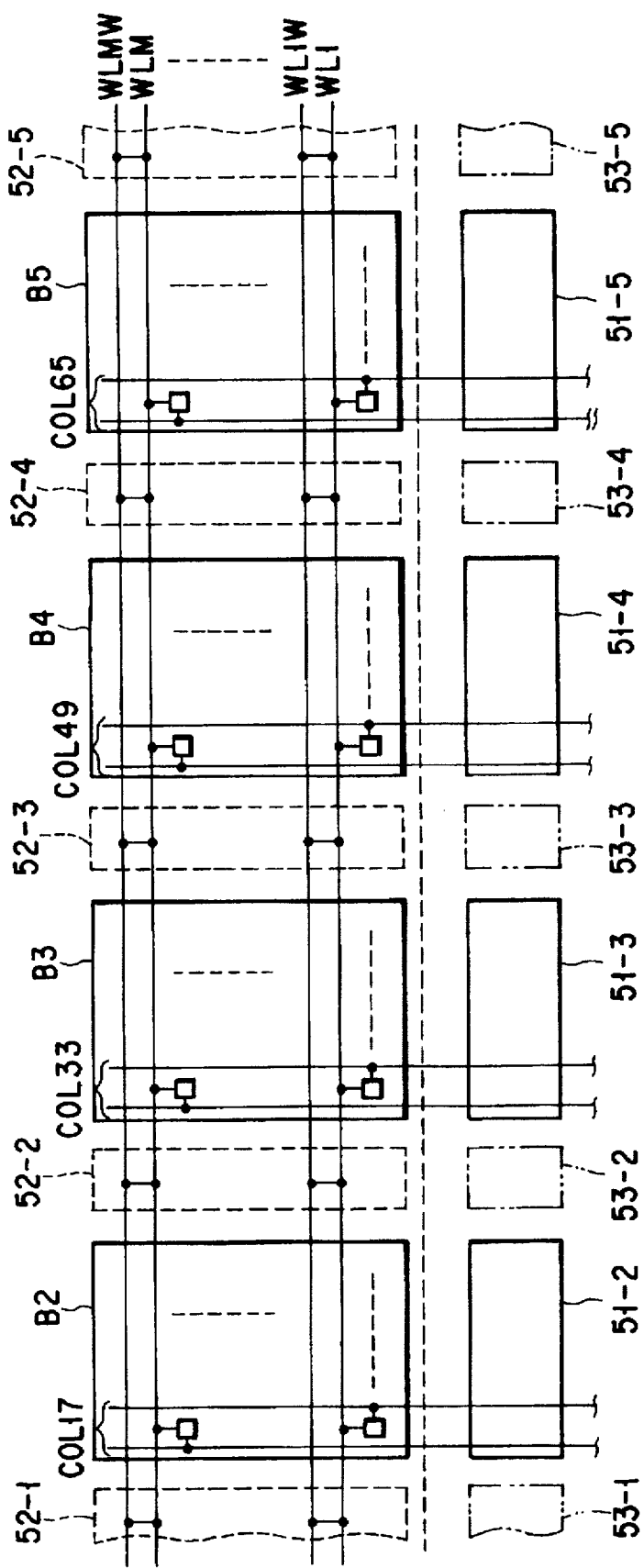
FIG. 14 is a plan view of a dynamic RAM according to a second embodiment of this invention.
Figure 15:
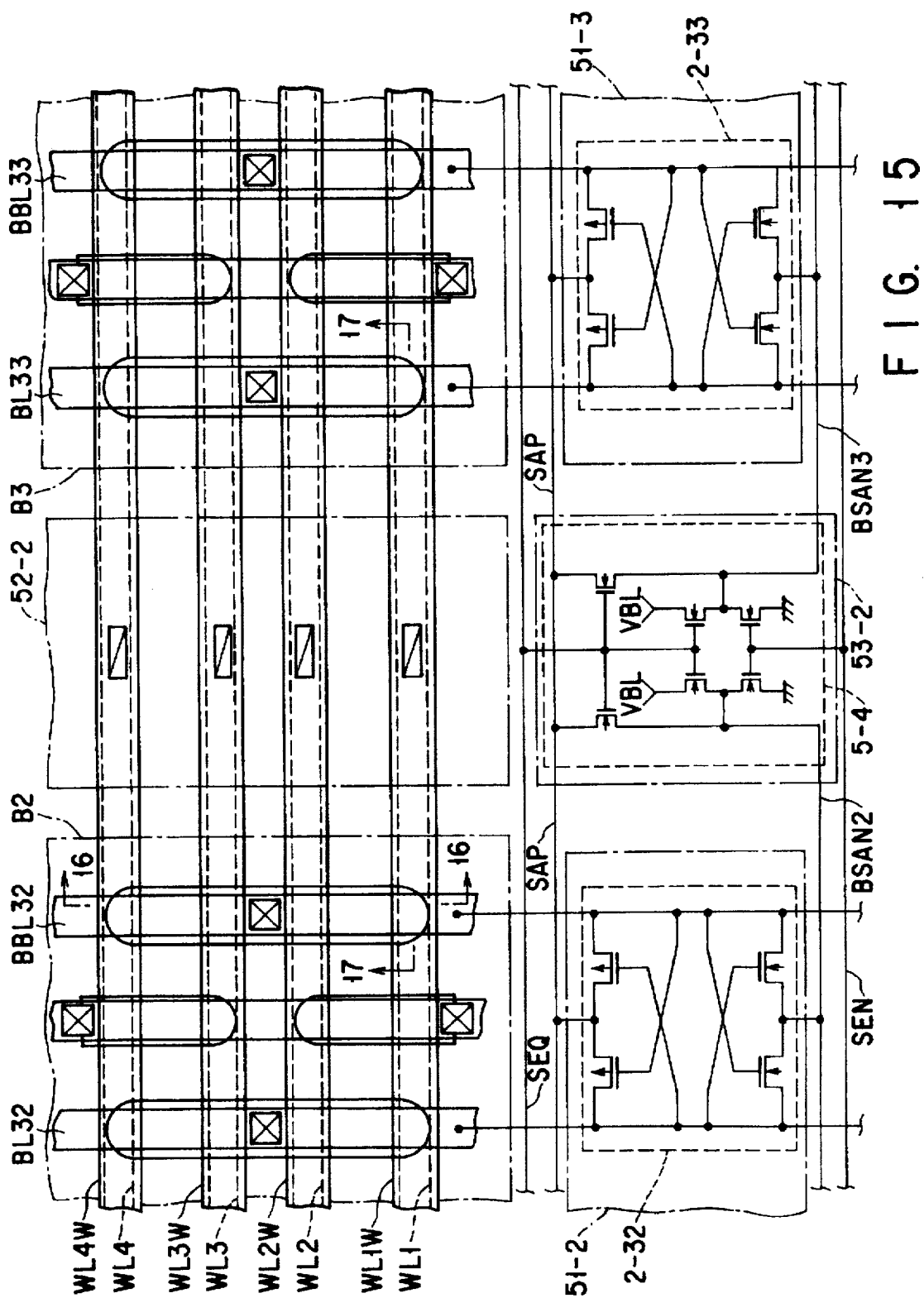
FIG. 15 is a plan view specifically showing an enlarged detail of a tap area 52-2 of the plane pattern shown in FIG. 14 and the surrounding portion thereof.

Next, a DRAM according to a second embodiment of this invention is explained. FIG. 14 is a plan view showing a plane pattern of the DRAM according to the second embodiment of this invention, FIG. 15 is a plan view more specifically showing an area between blocks B2 and B3 in the plane pattern of FIG. 14, FIG. 16 is a cross sectional view taken along the line 16—16 of FIG. 15, and FIG. 17 is a cross sectional view taken along the line 17—17 of FIG. 15.

The DRAM shown in FIGS. 14 to 17 has a larger memory capacity and a larger number of blocks.

The DRAM has buried plate electrode type cells shown in FIGS. 16 and 17 as memory cells, for example, and as shown in FIGS. 14 to 17, in some of the DRAMs having a large memory capacity, word lines WL acting as the gates of transfer transistors and bypass word lines connected in shunt with the word lines and having lower resistance are provided. The bypass word lines WLW are connected to the respective word lines WL for every 16 columns, for example. Each of the divisions for every 16 columns is used as a block. For example, 16 blocks are provided. In FIG. 14, four blocks B2 to B5 among the 16 divided blocks B1 to B16 are shown.

Sense amplifier groups are provided for the respective blocks. The sense amplifier groups are formed in areas 51 (which are hereinafter referred to as sense amplifier group forming areas) adjacent to the respective blocks in the column direction. Further, areas 52 for formation of contact holes used for connecting the bypass word lines WLW to the corresponding word lines WL are provided between the respective blocks. The areas 52 are sometimes called tap areas, and the areas 52 are hereinafter referred to as tap areas.

As specifically shown in FIG. 14, in the conventional DRAM, no transistor is formed in areas 53 which are disposed between the respective sense amplifier group forming areas 51 and adjacent to the corresponding tap areas 52.

In the DRAM of the second embodiment, divided sense amplifier driver and precharger circuits are formed in the respective areas 53. In FIG. 15, the driver and precharger circuit 5-4 formed in the area 53-2 which is disposed between the sense amplifier group forming areas 51-2 and 51-3 and adjacent to the corresponding tap area 52-2 is specifically shown.

With the above construction, even if the number of transistors is increased by dividing the driver and precharger circuits, the chip area can be prevented from being increased. Therefore, the DRAM of this invention can be realized with the chip kept in a compact form.

As described above, according to this invention, a semiconductor memory device can be provided in which even when simultaneous data transfer is performed in a large number of columns, destruction of data can be prevented in the columns in which data transfer is not performed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   a memory cell array having a plurality of memory cells arranged in rows and columns;
   a plurality of bit line pairs, each bit line pair having first and second bit lines which are connected to the memory cells in a corresponding column of said memory cell array;
   a plurality of sense amplifiers, each sense amplifier amplifying a potential difference between the bit lines of a corresponding one of said bit line pairs;
   a plurality of activation circuits for activating said plurality of sense amplifiers;
   a data bus for supplying input data to said plurality of memory cells;
   a plurality of storage circuits; each storage circuit associated with a corresponding one of the columns of said memory cell array, for storing the input data supplied from said data bus;
   a plurality of transfer circuits for transferring the input data stored in said storage circuits from said storage circuits to said sense amplifiers; and
   a transfer control circuit for controlling said plurality of transfer circuits to simultaneously transfer the input data stored in one or more of said storage circuits to said sense amplifiers;
   wherein said memory cell array is divided into a plurality of sub-arrays each including one or more columns of said memory cell array and at least one activation circuit is provided for each respective sub-arrays.

2. A semiconductor memory device according to claim 1, wherein each activation circuit includes a driver for driving corresponding ones of said sense amplifiers and precharging circuitry for precharging said corresponding ones of said sense amplifiers.

3. A semiconductor memory device according to claim 1, wherein each sense amplifier includes a cross-coupled type insulated gate FET pair of a first conductivity type whose drains are connected to each other and a cross-coupled type insulated gate FET pair of a second conductivity type whose drains are connected to each other; and
   each activation circuit includes a first circuit section for driving and precharging said insulated gate FET pair of the first conductivity type of corresponding ones of said sense amplifiers and at least some of said plurality of activation circuits each include a second circuit section for driving and precharging said insulated gate FET pair of the second conductivity type of corresponding ones of said sense amplifiers.

4. A semiconductor memory device according to claim 3, wherein the first conductivity type is an N type and the second conductivity type is a P type.

5. A semiconductor memory device according to claim 3, wherein each activation circuit includes a driver for driving said corresponding ones of said sense amplifiers and said driver includes a power supply circuit for supplying a power supply voltage to the drains of said FET pair of the second conductivity type of said corresponding ones of said sense amplifiers and supplying a reference voltage to the drains of said FET pair of the first conductivity type of said corresponding ones of said sense amplifiers.

6. A semiconductor memory device according to claim 3, wherein each activation circuit includes a precharging circuit for precharging said corresponding ones of said sense amplifiers and said precharging circuit supplies a precharge signal having a voltage equal to half the sum of the power supply voltage and the reference voltage to the drains of said FET pairs of the first and second conductivity types of said corresponding ones of said sense amplifiers.

7. A semiconductor memory device according to claim 3, wherein the number of the columns contained in each sub-array is set to a value which prevents a voltage drop occurring in the precharge signal of said activation circuits from exceeding the threshold voltage of FETs comprising said FET pair of the first conductivity type when all of the FET pairs of the first conductivity type contained in said sub-array have received the input data.

8. A semiconductor memory device according to claim 1, which further comprises a column decoder for decoding a column address signal corresponding to a column of said storage circuit in which the input data is to be stored and generating a corresponding column selection signal; and in which said transfer control circuit specifies a column in which the input data stored in said storage circuit is transferred to a corresponding one of said sense amplifiers according to the column selection signal and controls said transfer circuits to simultaneously transfer the input data to said sense amplifiers.

9. A semiconductor memory device according to claim 1, wherein said transfer control circuit controls and deactivates said transfer circuits when data is fetched from said data bus to said storage circuits.

10. A semiconductor memory device according to claim 1, further comprising column selection circuits provided between said data bus and said storage circuits and whose conduction state is controlled by a column decoder.

11. A semiconductor memory device comprising:
    a memory cell array having a plurality of memory cells arranged in rows and columns;
    a plurality of word lines, each word line connected to the memory cells which are disposed in a corresponding row of said memory cell array;
    a plurality of bit line pairs, each bit line pair having first and second bit lines which are connected to the memory cells in a corresponding column of said memory cell array;
    a plurality of sense amplifiers, each sense amplifier amplifying a potential difference between the bit lines of a corresponding one of said bit line pairs;
    a plurality of activation circuits for activating said plurality of sense amplifiers;
    a data bus for supplying input data to said plurality of memory cells;
    a plurality of storage circuits, each storage circuit associated with a corresponding one of the columns of said memory cell array, for storing the input data supplied from said data bus;
    a plurality of transfer circuits for transferring the input data stored in said storage circuits from said storage circuits to said sense amplifiers; and
    a transfer control circuit for controlling said plurality of transfer circuits to simultaneously transfer the input data stored in one or more of said storage circuits to said sense amplifiers;
    wherein said memory cell array is divided into a plurality of sub-arrays each including one or more columns of said memory cell array, each of said plurality of sub-arrays and its corresponding sense amplifiers are formed in a respective area, and at least one activation circuit is provided for each respective sub-arrays and each activation circuit is formed at least partly in an area disposed between an adjacent two of said respective areas.

12. A semiconductor memory device according to claim 11, further comprising a plurality of bypass word lines respectively formed for said plurality of word lines and insulated from said plurality of word lines, wherein said bypass word lines are connected to said word lines in an area disposed between said separated areas.

13. A semiconductor memory device according to claim 11, wherein each sense amplifier includes a cross-coupled type insulated gate FET pair of a first conductivity type whose drains are connected to each other and a cross-coupled type insulated gate FET pair of a second conductivity type whose drains are connected to each other; and each activation circuit includes a first circuit section for driving and precharging said insulated gate FET pair of the first conductivity type of corresponding ones of said sense amplifiers and at least some of said plurality of activation circuits each include a second circuit section for driving and precharging said insulated gate FET pair of the second conductivity type of corresponding ones of said sense amplifiers.

14. A semiconductor memory device according to claim 13, wherein the first conductivity type is an N type and the second conductivity type is a P type.

15. A semiconductor memory device according to claim 13, wherein each activation circuit includes a driver for driving said corresponding ones of said sense amplifiers and said driver includes a power supply circuit for supplying a power supply voltage to the drain of said FET pair of the second conductivity type of said corresponding ones of said sense amplifiers and supplying a reference voltage to the drain of said FET pair of the first conductivity type of said corresponding ones of said sense amplifiers.

16. A semiconductor memory device according to claim 13, wherein each activation circuit includes a precharging circuit for precharging said corresponding ones of said sense amplifiers and said precharging circuit supplies a precharge signal having a voltage equal to half the sum of the power supply voltage and the reference voltage to the drains of said FET pairs of the first and second conductivity types of said corresponding ones of said sense amplifiers.

17. A semiconductor memory device according to claim 13, wherein the number of the columns contained in each sub-array is set to a value which prevents a voltage drop occurring in the precharge signal of said activation circuits from exceeding the threshold voltage of FETs comprising said FET pair of the first conductivity type when all of the FET pairs of the first conductivity type contained in said sub-array have received the input data.

18. A semiconductor memory device according to claim 11, which further comprises a column decoder for decoding a column address signal corresponding to a column of said storage circuit in which the input data is to be stored and generating a column selection signal; and in which said transfer control circuit specifies a column in which the input data stored in said storage circuit is transferred to a corresponding one of said sense amplifiers according to the column selection signal and controls said transfer circuits to simultaneously transfer the input data to said sense amplifiers.

19. A semiconductor memory device according to claim 11, wherein said transfer control circuit controls and deactivates said transfer circuits when data is fetched from said data bus to said storage circuits.

20. A semiconductor memory device according to claim 11, further comprising column selection circuits provided between said data bus and said storage circuits and whose conduction state is controlled by a column decoder.

21. A semiconductor memory device according to claim 1, wherein said sense amplifiers comprise latch type sense amplifiers.

22. A semiconductor memory device according to claim 1, wherein said storage circuits comprise latch type storage circuits.

23. A semiconductor memory device according to claim 11, wherein said sense amplifiers comprise latch type sense amplifiers.

24. A semiconductor memory device according to claim 11, wherein said storage circuits comprise latch type storage circuits.

* * * * *